(12) United States Patent
Eldridge et al.

(10) Patent No.: US 6,759,311 B2
(45) Date of Patent: Jul. 6, 2004

(54) FAN OUT OF INTERCONNECT ELEMENTS ATTACHED TO SEMICONDUCTOR WAFER

(75) Inventors: Benjamin N. Eldridge, Danville, CA (US); Igor Y. Khandros, Orinda, CA (US)

(73) Assignee: FormFactor, Inc., Livermore, CA (US)

( * ) Notice: Subject to any disclaimer, the term of this patent is extended or adjusted under 35 U.S.C. 154(b) by 0 days.

(21) Appl. No.: 10/001,437

(22) Filed: Oct. 31, 2001

(65) Prior Publication Data

US 2003/0082890 A1 May 1, 2003

(51) Int. Cl.⁷ .................... H01L 21/301; H01L 21/46; H01L 21/78

(52) U.S. Cl. .................... 438/460; 438/461; 438/462; 438/113; 438/117; 438/617

(58) Field of Search .................... 438/106, 113, 438/460, 464, 461, 617

(56) References Cited

U.S. PATENT DOCUMENTS

| | | | |
|---|---|---|---|
| 3,447,235 A | * 6/1969 | Rosvold et al. | 438/421 |
| 3,550,261 A | 12/1970 | Schroeder | |
| 3,849,872 A | 11/1974 | Hubacher | |
| 4,032,058 A | 6/1977 | Riseman | |
| 4,086,375 A | * 4/1978 | LaChapelle et al. | 438/461 |
| 4,137,867 A | 2/1979 | Aigo | |
| 4,281,449 A | 8/1981 | Ports et al. | |
| 4,486,945 A | 12/1984 | Aigoo | |
| 4,732,313 A | 3/1988 | Kobayashi et al. | |
| 4,751,199 A | 6/1988 | Phy | |
| 5,070,297 A | 12/1991 | Kwon et al. | |
| 5,185,502 A | 2/1993 | Shepherd et al. | |
| 5,195,237 A | 3/1993 | Cray et al. | |
| 5,210,939 A | 5/1993 | Mallik et al. | |
| 5,323,035 A | 6/1994 | Leedy | |
| 5,391,521 A | 2/1995 | Kim | |
| 5,442,282 A | 8/1995 | Rostoker et al. | |
| 5,495,667 A | 3/1996 | Farnworth et al. | |
| 5,513,430 A | 5/1996 | Yanof et al. | |
| 5,648,661 A | 7/1997 | Rostoker et al. | |
| 5,666,190 A | 9/1997 | Quate et al. | |
| 5,677,566 A | 10/1997 | King et al. | |

(List continued on next page.)

FOREIGN PATENT DOCUMENTS

| | | |
|---|---|---|
| JP | 147090 | 2/1989 |
| JP | 2034949 | 2/1990 |
| JP | 3142847 | 6/1991 |
| JP | 6018555 | 1/1994 |
| JP | 7333232 | 12/1995 |
| JP | 8306708 | 11/1996 |
| WO | WO 00/03569 | 1/2000 |
| WO | WO 00/33096 | 6/2000 |

OTHER PUBLICATIONS

Goldstein, "Packages Go Vertical," IEEE Spectrum, pp. 46–51 (Aug. 2001).

Bracken et al., "Assembly and Packaging," Handbook of Semiconductor Manufacturing, pp. 999–1025 (New York 2000).

"Method of Testing Chips and Joining Chips to Substrates," 2244 Research Disclosure, No. 322 (Emsworth, Great Britain Feb. 1991).

*Primary Examiner*—John F. Niebling
*Assistant Examiner*—Angel Roman
(74) *Attorney, Agent, or Firm*—N. Kenneth Burraston; Stuart L. Merkadeau

(57) ABSTRACT

An unsingulated semiconductor wafer is provided. Electrical interconnect elements are formed on the unsingulated wafer such that the interconnect elements are electrically connected to terminals of the semiconductor dice composing the wafer. At least a portion of the interconnect elements extend beyond the boundaries of the dice into the scribe streets separating the individual dice. Thereafter, the wafer is singulated into individual dice.

33 Claims, 39 Drawing Sheets

U.S. PATENT DOCUMENTS

| | | | |
|---|---|---|---|
| 5,701,666 A | | 12/1997 | DeHaven et al. |
| 5,723,894 A | | 3/1998 | Ueno et al. |
| 5,764,486 A | | 6/1998 | Pendse |
| 5,786,270 A | | 7/1998 | Gorrell et al. |
| 5,820,014 A | | 10/1998 | Dozier, II et al. |
| 5,824,177 A | * | 10/1998 | Yoshihara et al. .......... 156/250 |
| 5,828,226 A | | 10/1998 | Higgins et al. |
| 5,829,128 A | | 11/1998 | Eldridge et al. |
| 5,847,445 A | | 12/1998 | Wark et al. |
| 5,897,326 A | * | 4/1999 | Eldridge et al. .............. 438/14 |
| 6,002,266 A | | 12/1999 | Briggs et al. |
| 6,023,103 A | | 2/2000 | Chang et al. |
| 6,031,282 A | | 2/2000 | Jones et al. |
| 6,053,395 A | | 4/2000 | Sasaki |
| 6,064,213 A | | 5/2000 | Khandros et al. |
| 6,074,896 A | * | 6/2000 | Dando ........................ 438/114 |
| 6,080,596 A | | 6/2000 | Vindasius et al. |
| 6,117,694 A | | 9/2000 | Smith et al. |
| 6,174,744 B1 | | 1/2001 | Watanabe et al. |
| 6,184,576 B1 | | 2/2001 | Jones et al. |
| 6,207,477 B1 | * | 3/2001 | Motooka et al. ............ 438/113 |
| 6,255,126 B1 | | 7/2001 | Mathieu et al. |
| 6,336,269 B1 | | 1/2002 | Eldridge et al. |
| 6,350,664 B1 | * | 2/2002 | Haji et al. ................... 438/459 |
| 6,365,443 B1 | * | 4/2002 | Hagiwara et al. ........... 438/130 |
| 6,406,937 B1 | * | 6/2002 | Hedler ....................... 438/108 |

* cited by examiner

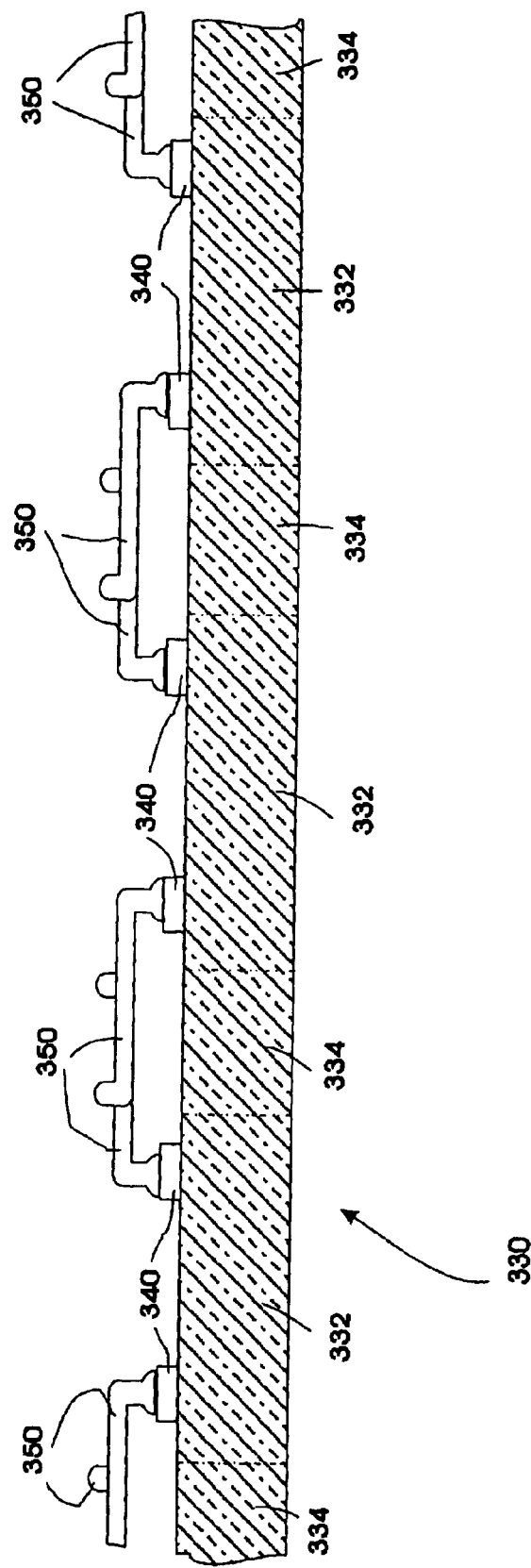

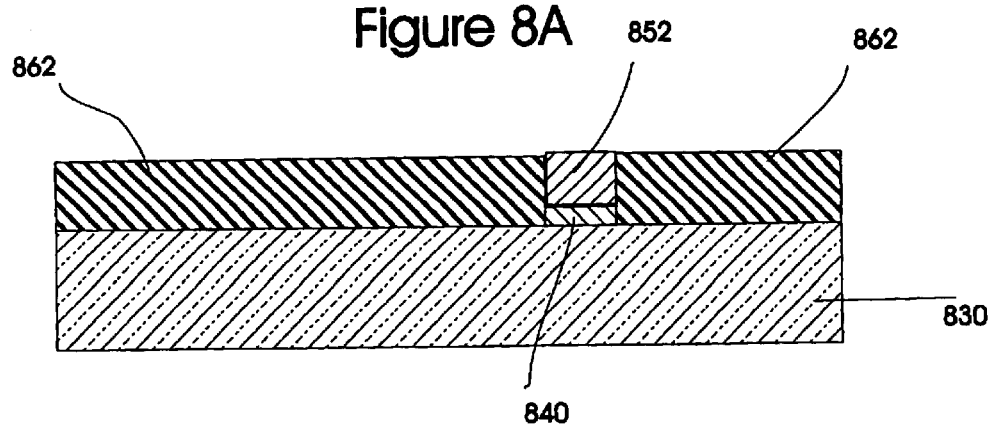
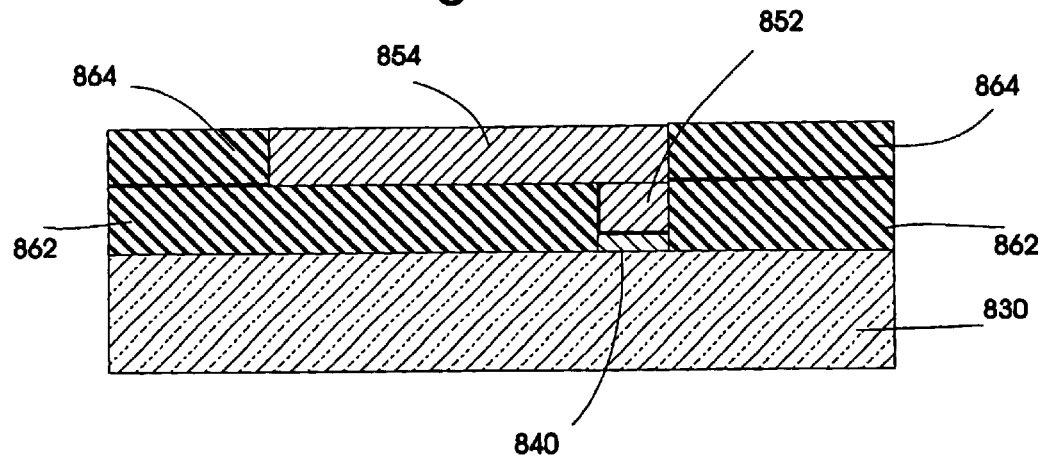

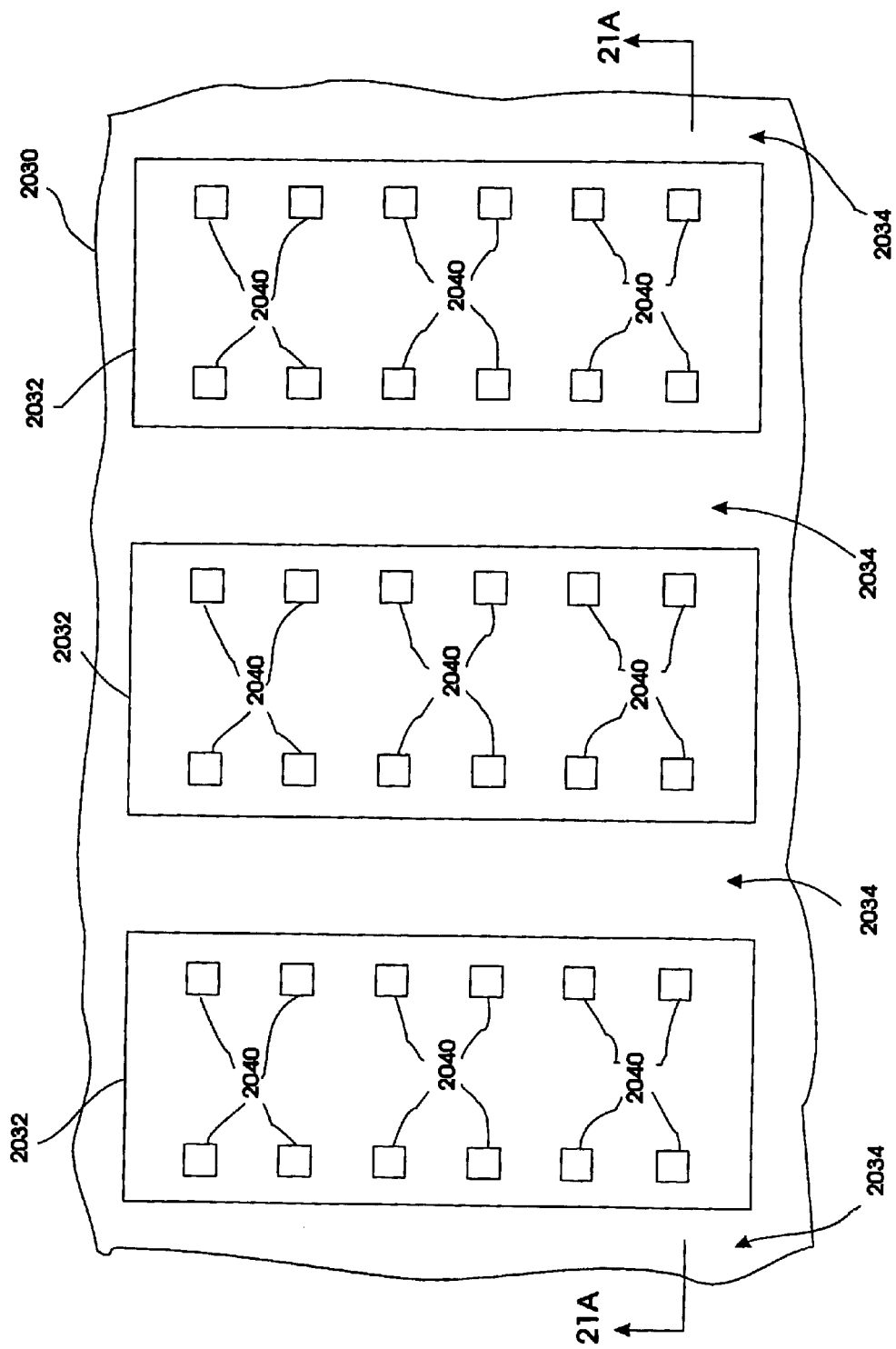

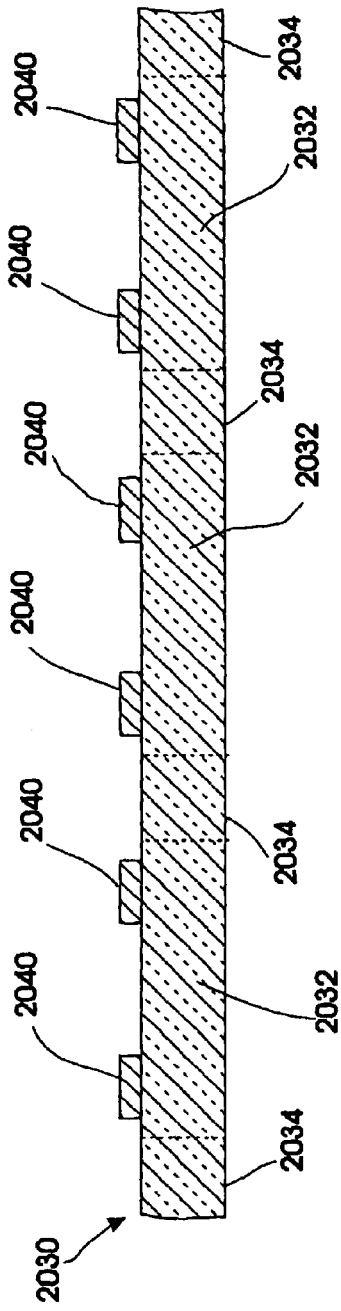
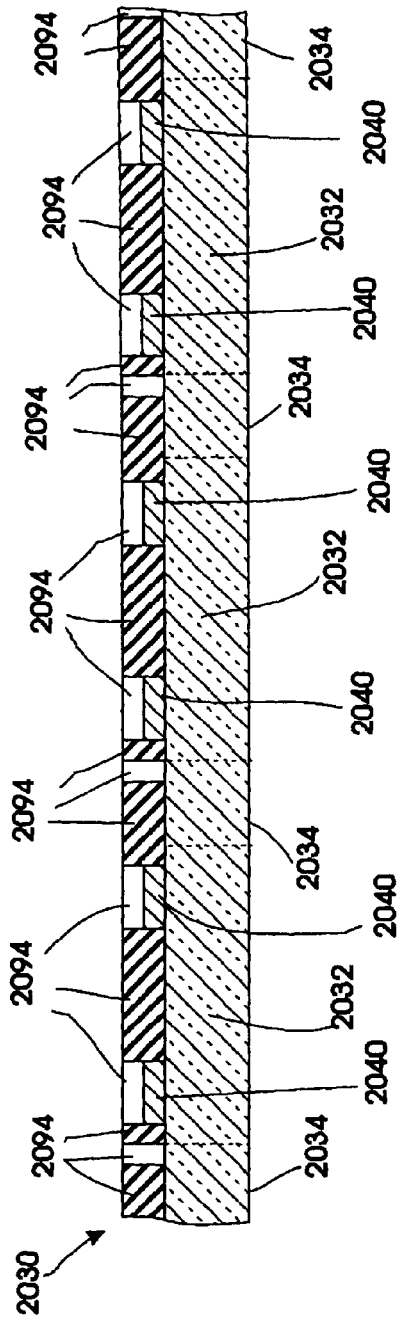
Figure 21A
Figure 21B

FAN OUT OF INTERCONNECT ELEMENTS ATTACHED TO SEMICONDUCTOR WAFER

FIELD OF THE INVENTION

In general, the invention relates to processing of semiconductor wafers and has particular applicability to formation of interconnect elements on semiconductor devices while in wafer form.

BACKGROUND OF THE INVENTION

As is known, microelectronic or integrated circuits are manufactured by forming identical such circuits on each of a many devices or dice on a semiconductor wafer. Eventually, the wafer is divided or "singulated" into the individual devices or dice. Typically, this involves cutting, e.g., using a very fine saw, laser, kerfing tool, dicing tool, or the like, the wafer along spaces between the dice, which spaces customarily are referred to as "scribe streets" or "kerf lines."

Each of the individual die on a wafer include terminals that function as connection points into and out of the microelectronic circuit on the die. Eventually, interconnect elements are attached to the terminals. In use, these interconnect elements form electrical connections with an external element, allowing the external element and the die to communicate electrically. Examples of such external elements include without limitation printed circuit boards, other die, and other electronic elements.

Commonly used interconnect elements include metal pins, solder balls, metal bumps, and metal pads. Resilient, elongated, spring-type interconnect elements, which have recently been developed, may also be used. Examples of such interconnect elements are described in this application and in applications incorporated herein by reference.

Many, but not all, semiconductor devices (i.e., die) are also packaged. That is, a protective material is formed on or around at least a portion of the die. The protective material may serve a number of functions, including without limitation protecting the die, strengthening the die, and dissipating heat generated by the die. Plastics, metals, ceramics, resins, and organic materials are nonexclusive examples of commonly used packaging materials. Of course, the interconnect elements attached to a die's terminals must extend through the die's packaging.

Traditionally, a wafer is singulated into individual die before interconnect elements are attached to the dice's terminals and before the dice are packaged. It is known, however, to attach interconnect elements to the terminals of a die and/or package the die while the die is still in wafer form (that is, before the wafer has been singulated). This is sometimes referred to as "wafer level packaging."

According to conventional wisdom, the interconnect elements and the packaging materials formed on a die of an unsingulated wafer must be located entirely within the boundary of the die on the wafer. That is, neither the interconnect elements nor the packaging materials may extend beyond the boundary of the die into the scribe streets surrounding the die. This limitation arises primarily because such interconnect elements or packaging materials would interfere with any subsequent attempt to cut the wafer along its scribe streets.

That interconnect elements and packaging materials are confined to the area of the die imposes disadvantages on the use of wafer level packaging. One such disadvantage is a corresponding restriction on the pitch and layout of the interconnect elements. Simply put, the pitch of interconnect elements located entirely within the boundary of a die must be finer or tighter than the pitch of interconnect elements that fan out beyond the boundary of the die (as is the case where the interconnect elements are attached to the die after it has been singulated from the wafer). Of course, the finer the pitch of the interconnect elements on the die, the finer the pitch that is required of the connection receptacles on the external element (e.g., printed circuit board) to which the die will be connected in use. Generally speaking, the finer the pitch of the connection receptacles, the greater the cost of the external element.

Similarly, requiring that the interconnect elements be confined entirely within the boundary of the die also limits the pattern or layout of the interconnect elements. That is, the greater the area in which the interconnect elements can be located, the more freedom there is in locating each interconnect element and therefore the more freedom there is in selecting the pattern or layout of the interconnect elements. Again, the loss of such freedom associated with wafer level packaging increases costs.

As should be apparent, a way of packaging a die—and in particular, of attaching interconnect elements to terminals of the die—while in wafer form that allows the interconnect elements to fan out beyond the boundaries of the die is needed.

SUMMARY OF THE INVENTION

The present invention relates to processing of semiconductor devices while in wafer form and more particularly to formation of interconnect elements that fan out beyond the boundary of a die. An unsingulated semiconductor wafer is provided. Electrical interconnect elements are formed on the unsingulated wafer such that the interconnect elements are electrically connected to terminals of the semiconductor dice composing the wafer. At least a portion of the interconnect elements extend beyond the boundaries of the dice into the scribe streets separating the individual dice. Thereafter, the wafer is singulated into individual dice.

BRIEF DESCRIPTION OF THE DRAWINGS

FIGS. 4A and 4B are side cross-sectional views of the wafer of FIG. 3B.

FIG. 20A is a top view of a portion of an unsingulated wafer showing three exemplary dice.

FIGS. 21A–21D are side cross-sectional views of FIG. 20A–20D.

DETAILED DESCRIPTION OF EMBODIMENTS OF THE INVENTION

The present invention relates to processing of semiconductor wafers and more particularly to formation of interconnect elements that fan out beyond the boundary of a die. This specification describes several exemplary embodiments and applications of the invention. The invention, however, is not limited to these exemplary embodiments and applications or to the manner in which the exemplary embodiments and applications operate or are described herein.

Figure 1:
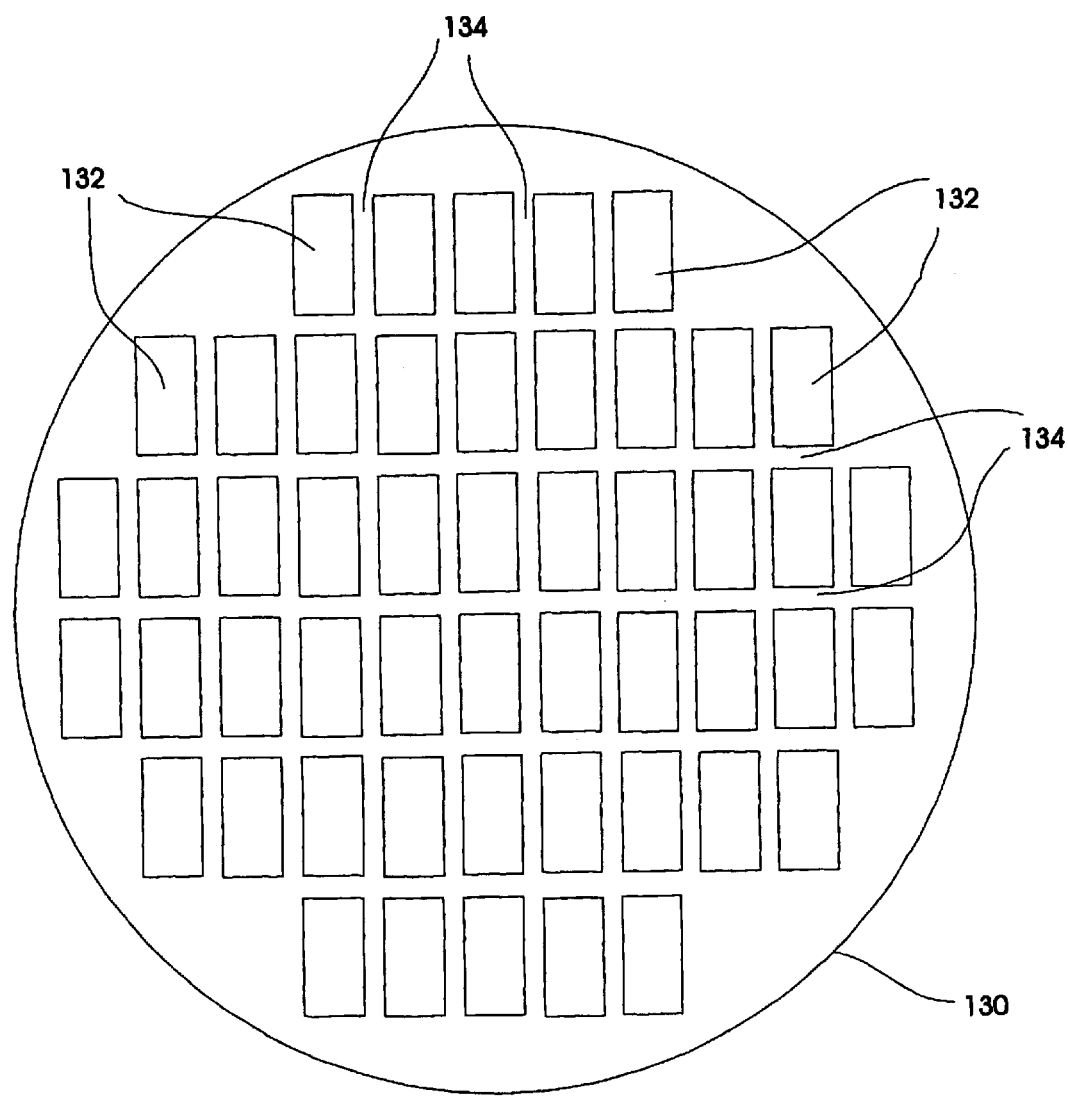
FIG. 1 is a simplified top view of a semiconductor wafer on which are formed a plurality of semiconductor devices or "dice."

FIG. 1 illustrates a typical semiconductor wafer 130. As is known, a plurality of semiconductor devices or "dice" 132 are formed on the wafer. Each device or die typically includes one or more microelectronic circuits formed thereon. Many different types of circuits are routinely formed on semiconductor dice, including without limitation memory circuits, microprocessor circuits, microcontroller circuits, logic circuits, application specific circuits, analog circuits, etc. As is also known, conductive terminals or pads are formed on each die (not shown in FIG. 1), which provide electrical communication into and out of the circuit on the dice. Sufficient space 134 is provided between each die 132 and its neighbors to allow the wafer to be singulated into the individual die. This space is typically referred to as "scribe streets" or "kerf lines."

Figure 2:
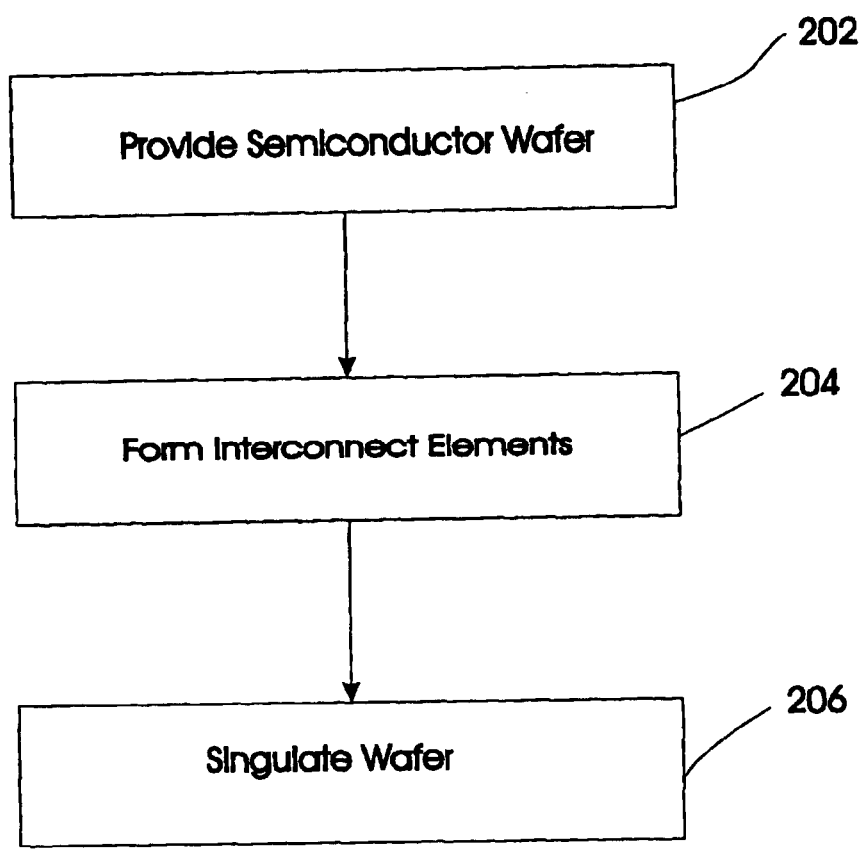
FIG. 2 illustrates an exemplary embodiment of a process incorporating the present invention.

FIG. 2 illustrates an exemplary embodiment of a process for forming interconnect elements on an unsingulated semiconductor wafer, where the interconnect elements "fan out" beyond the boundary of a die and into the scribe streets.

Figure 3A:
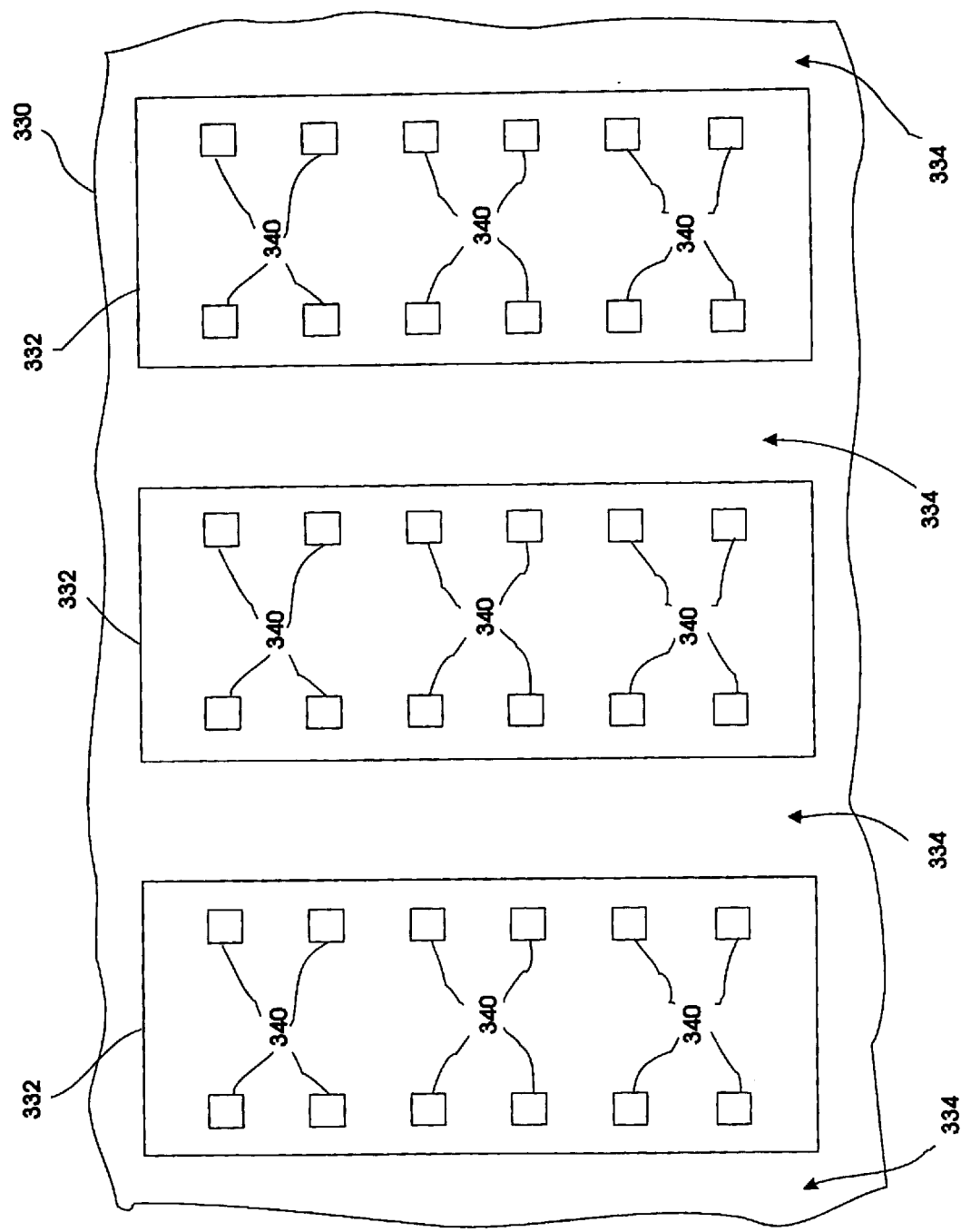
FIG. 3A is a top view of a portion of an unsingulated wafer showing three exemplary dice.

As shown, initially, an unsingulated semiconductor wafer with a plurality of dice formed thereon is provided at step 202. FIG. 3A illustrates a portion of an exemplary wafer 330 that may be provided at step 202 of FIG. 2. As can be seen, the illustrated portion consists of three exemplary dice 332, each having electrical terminals or pads 340 arranged along lengths of the dice. As is known in the field, a semiconductor die 32, depending on its design, may include only a few such pads or many pads, and the pads may be arranged on the die in just about any pattern imaginable. As shown, the three dice 332 are adjacent one another in a particular row of the wafer 332. As discussed above, scribe streets 334 separate one die 334 from another and provide space for singulating the dice. Although only scribe streets 334 between horizontally adjacent dice 332 are shown in the portion of the wafer 330 illustrated in FIG. 3A, such scribe streets are also present between vertically adjacent dice.

Referring again to FIG. 2, interconnect elements are formed on the wafer at step 204. The interconnect elements are formed on the terminals of the dice of the wafer and provide electrical connections between the terminals and points outside the dice. Importantly, the interconnect elements fanout from the dice, that is, the interconnect elements on a particular die extend from the terminals on the die beyond the boundary of the die and into a scribe street. Typically, the interconnect element will extend across the scribe street and into the boundary of a neighboring die. The interconnect element may, however, terminate within the scribe street such that it does not extend into or overlap the boundary of a neighboring die.

Figure 3B:
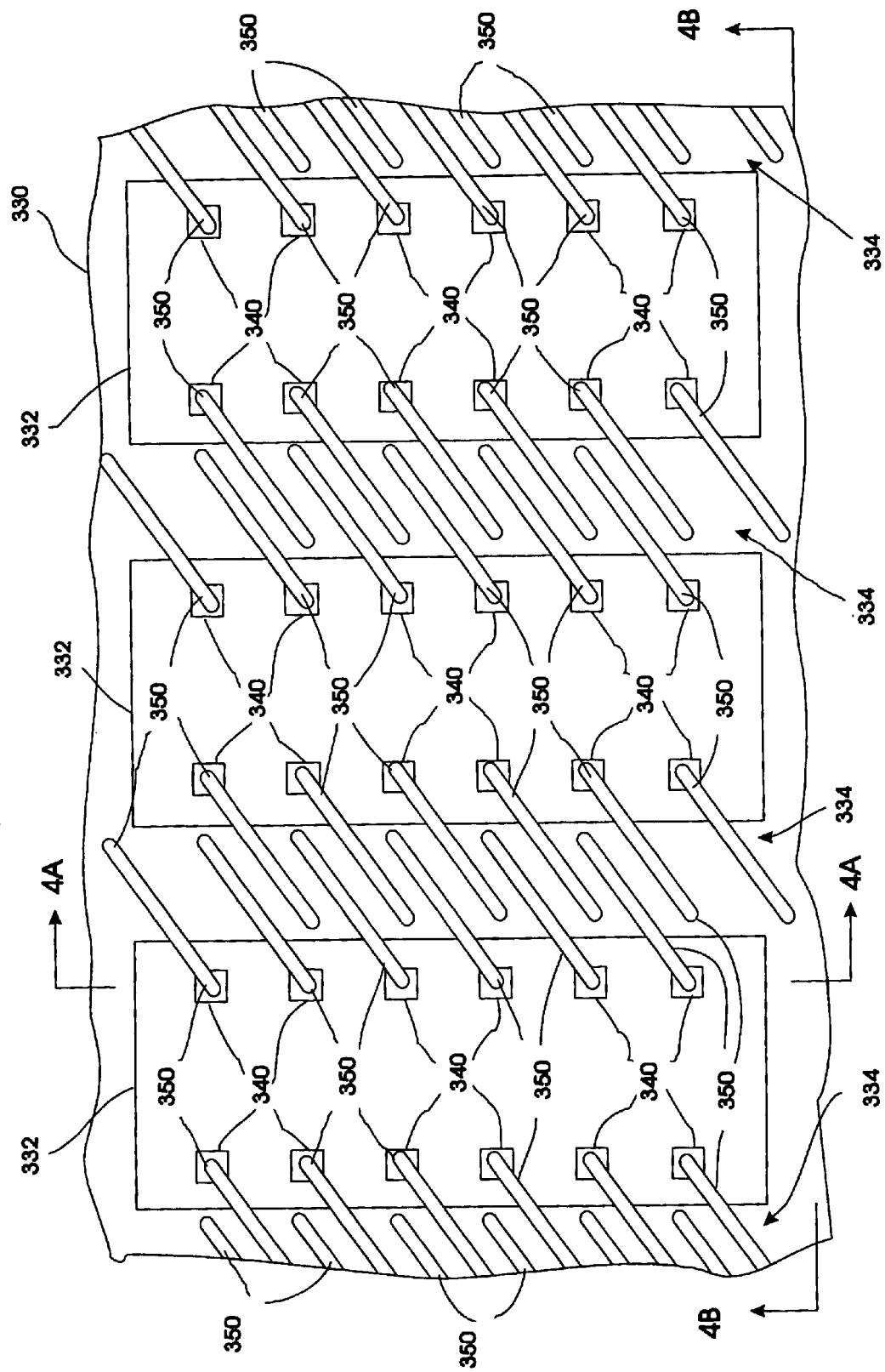
FIG. 3B is a top view of the wafer of FIG. 3A showing interconnect elements attached thereto.
Figure 4A:
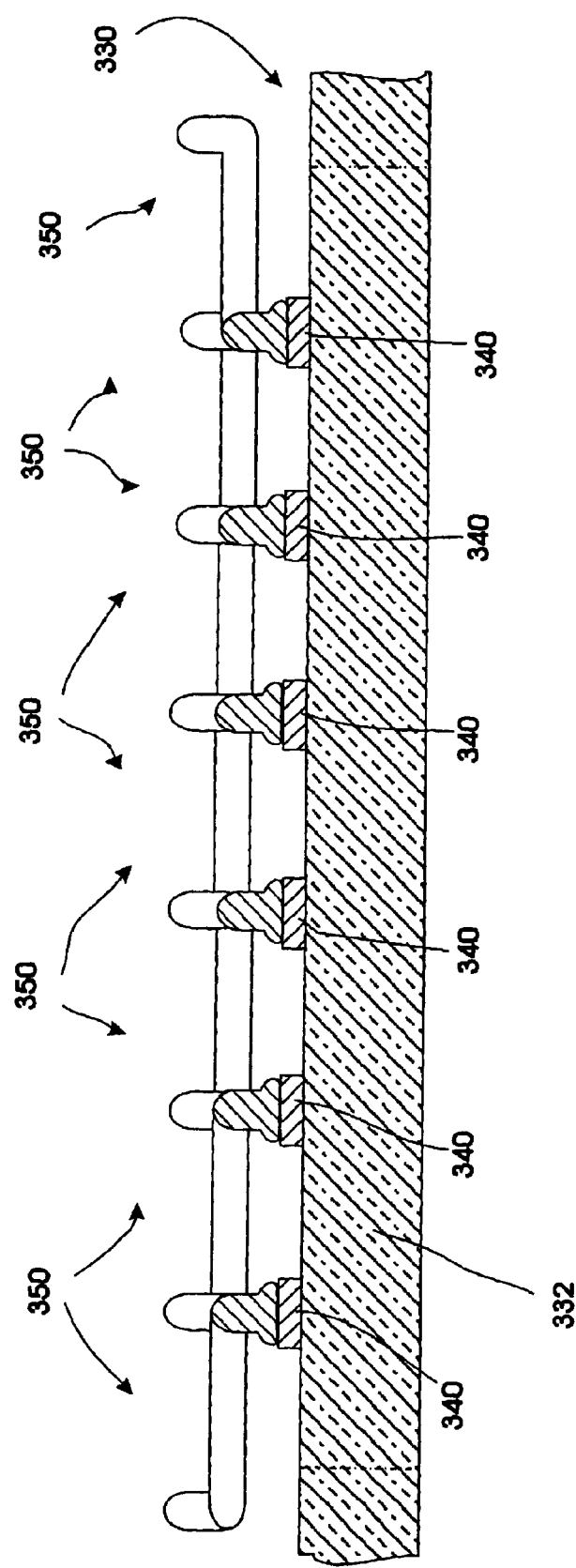

FIGS. 3B, 4A, and 4B illustrate an exemplary formation of interconnect elements 350 on the wafer 330 of FIG. 3A. (FIG. 3B illustrates a top view of the wafer 330; FIG. 4A illustrates a cross-sectional view of a die 332 taken through one of its vertical columns of terminals 340, as indicated in FIG. 3B; and FIG. 4B illustrates a cross-sectional view of the dice 332 taken through a horizontal scribe street (not labeled in FIG. 3B) just below the three dice 332, as also indicated in FIG. 3B.) As shown, elongate, interconnect elements 350 are formed on each of the terminals 340 of the dice 332. In the example shown in FIG. 3B (and FIGS. 4A and 4B), interconnect elements 350 on adjacent dice 332 are interleaved so that the interconnect elements do not contact or otherwise interfere with each other. It should be apparent, however, interleaving may not be desirable or necessary in all cases. It should also be understood that the particular interleave scheme illustrated in FIG. 3B is exemplary only. The present invention does not depend on any particular interleave scheme; consequently, any interleave scheme may be used with the present invention. (Indeed, additional exemplary interleave schemes are illustrated in FIGS. 9A–12B.) It should be noted that the size of the scribe streets 334 are typically more narrow than shown in FIG. 4B; the width of the scribe streets 334 as shown in FIG. 4B is exaggerated to ease illustration of the embodiment of the invention depicted in that figure.

The interconnect elements 350 illustrated in the exemplary embodiment of FIGS. 3B, 4A, and 4B must be elongate so as to extend from the dice terminals 340 beyond the boundaries of the dice 332. (It should be noted that, as discussed below with respect to FIGS. 19A–20D, other embodiments of the invention do not require that the interconnect elements be elongate.) In addition, although not required by the present invention, the interconnect elements 350 are preferably resilient or springy.

Figure 5:
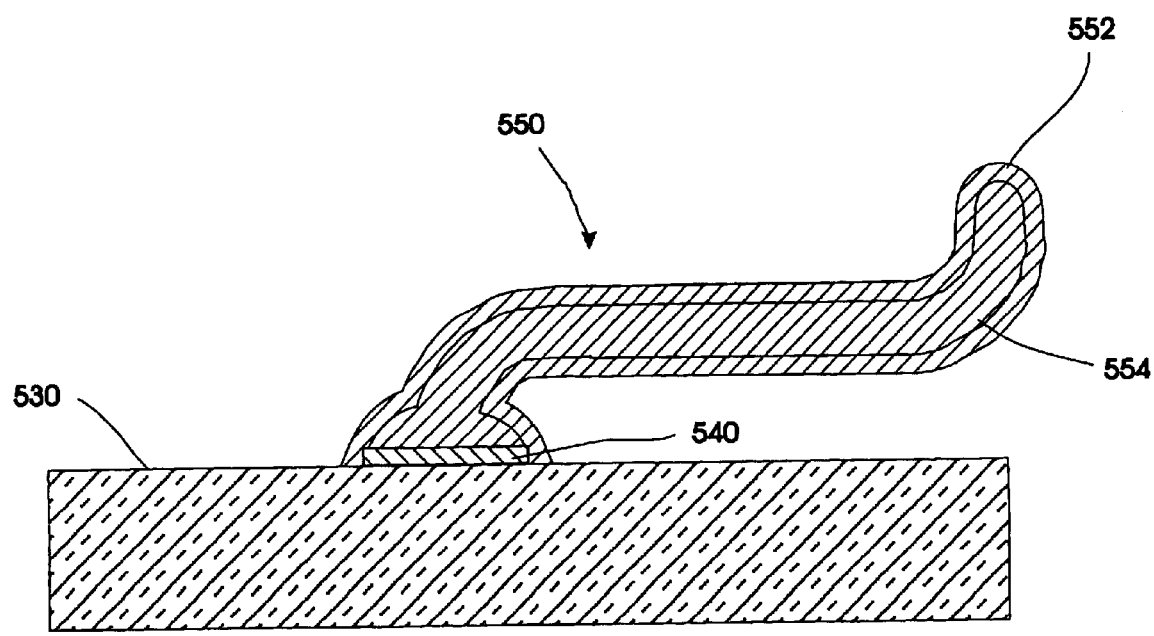
FIG. 5 illustrates an exemplary wire bond interconnect element.

FIG. 5 illustrates a cross-sectional view of an exemplary elongate, resilient interconnect element 550 that may be used with the present invention. The interconnect element 550 comprises a wire core 554 that is wire bonded to terminal 540 on wafer 530. Standard wire bonding techniques may be used. The wire core 554 is preferably made of a soft, readily shapeable material. Depending on the material selected, the wire core 554 may be formed into just about any shape. A soft, readily shapeable material, however, is usually not particularly strong or resilient. To make the structure strong and/or resilient, a coating 552 is formed over the wire core 554. The coating 552 is preferably made of a material that is stronger, harder and/or more resilient than the wire core 554. If this is the case, the coating 552 imparts strength, hardness, and/or resiliency to the interconnect element 550. By using a combination of a soft, readily shapeable material for the wire core 554 and a stronger, more resilient material for the coating 552, strong, resilient interconnect structures 550 may be formed in practically any shape. Thus, the shape illustrated in FIG. 5 is exemplary only. For example, elongate shapes with one or more changes in direction, bends, zigs, zags, etc. in any direction (e.g., the "x,", "y," and/or "z" directions with respect to FIG. 5) can be formed.

Although the interconnect element 550 illustrated in FIG. 5 consists of two materials (a wire core 554 and a coating 552), additional materials may be included in the composition of the interconnect element. For example, one or more additional coatings of materials may be included between the wire core 554 and the coating 552. Likewise, one or more coatings of other materials may be formed over coating 552. In addition, additives may optionally be added to one or more of the materials that comprise the interconnect structure 550, and the interconnect structure may be heat treated to improve or manipulate physical and mechanical properties of the structure. Exemplary additives and heat treatment are described in U.S. Pat. No. 6,150,186, which is incorporated herein by reference. Many variations of the interconnect element illustrated in FIG. 5, including shapes, structures, and manufacturing processes are described in detail in U.S. Pat. Nos. 5,476,211, 5,917,707, and 6,110,823, all of which are incorporated herein by reference.

Figure 6A:
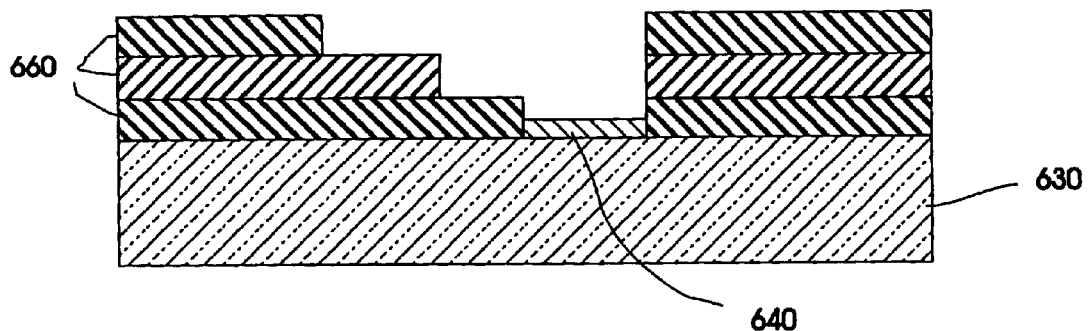
FIGS. 6A–8D illustrate various exemplary processes for lithographically forming exemplary interconnect elements.
Figure 6B:
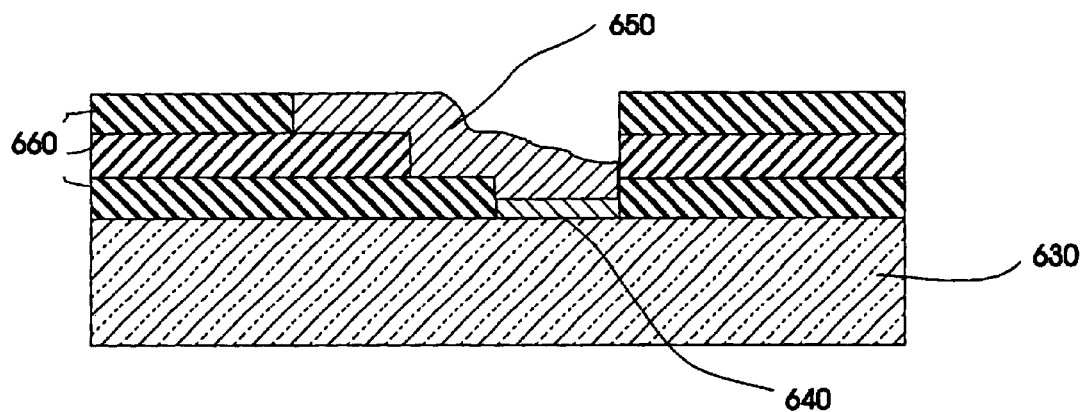
Figure 6C:
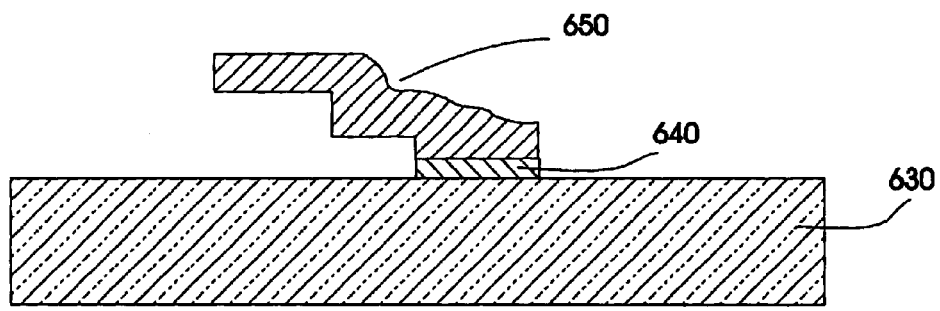

Elongate interconnect elements may alternatively be formed lithographically. FIGS. 6A–8 illustrate exemplary lithographic processes for forming elongate, resilient interconnect elements that may be used with the present invention. In FIG. 6A, one or more layers of masking materials 660 are formed on wafer 630. The masking layers 660 define both an opening exposing a terminal 640 and a shape for an elongate, resilient interconnect element 650 that is to be formed on the terminal. Once the masking layers 660 are formed on the wafer 640, material is deposited on the masking layers 660, forming interconnect element 650 on terminal 640 as shown in FIG. 6B. Thereafter, masking layers 660 are removed, leaving elongate interconnect element 650 attached to terminal 640, as shown in FIG. 6C.

Standard lithographic techniques known to those in the semiconductor field may be used to form the masking layers 660 on the wafer 630. The material deposited on the masking layers 660 may be a single, springy material. Alternatively, multiple depositions of different materials may be made on the masking layers 660 so that the interconnect element 650 is ultimately made of multiple layers of different materials. Moreover, the interconnect element 650 may be further processed after masking layers 660 are removed from the wafer 630. For example, the initial material deposited in the masking layers 660 may be a soft, readily shapeable material such as forms the inner core of the interconnect element 550 illustrated in FIG. 5. That material may then be coated, for example, after the masking layers 660 are removed, with a strong, resilient material as described above with regard to FIG. 5. As another example, the interconnect element 550 may be heat treated, for example, as described above with respect to FIG. 5.

Figure 7A:
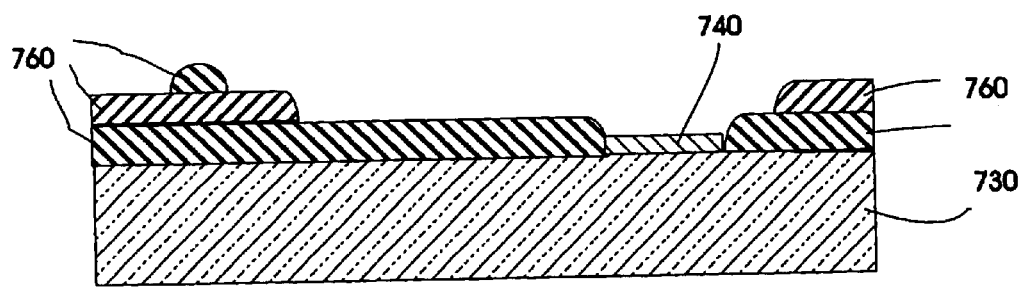
Figure 7B:
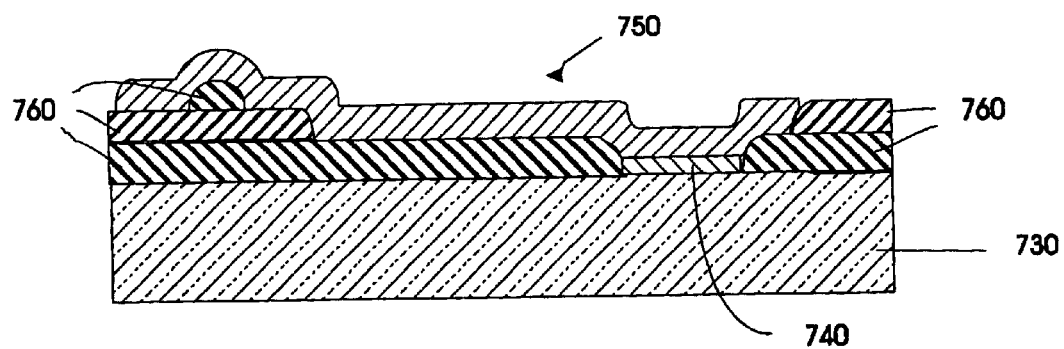
Figure 7C:
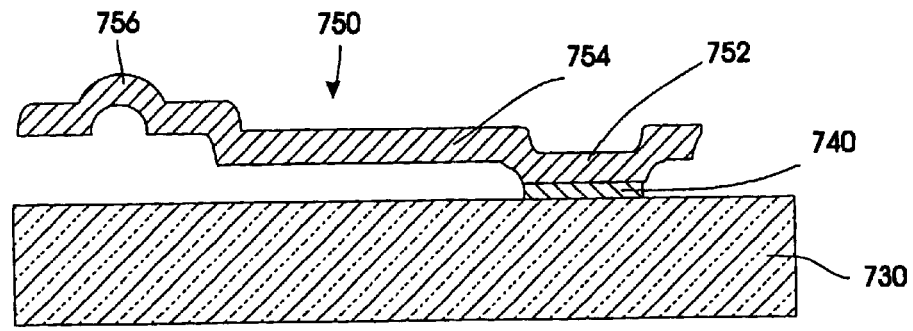

As should be apparent, the shapes and configurations of interconnection elements formed lithographically are almost limitless. By appropriately forming the masking layers 660, interconnection elements 650 having just about any contour, bend, change in direction, zig, zag, etc. in any location or direction (e.g., in any of the "x," "y," and/or "z" directions with respect to FIGS. 6A–6C) may be formed. FIGS. 7A–7C illustrate a nonexclusive example of a interconnect element 750 formed to have a base portion 752 attached to a terminal 740 on a wafer 730, a beam portion 754, and a contact portion 756. As shown in FIGS. 7A and 7B, masking layers 760 form a pattern into which one or more materials are deposited to form the interconnect element 750. Removing masking layers 760 leaves interconnect element 750 attached to terminal 740 on wafer 730, as shown in FIG. 7C.

Figure 8C:
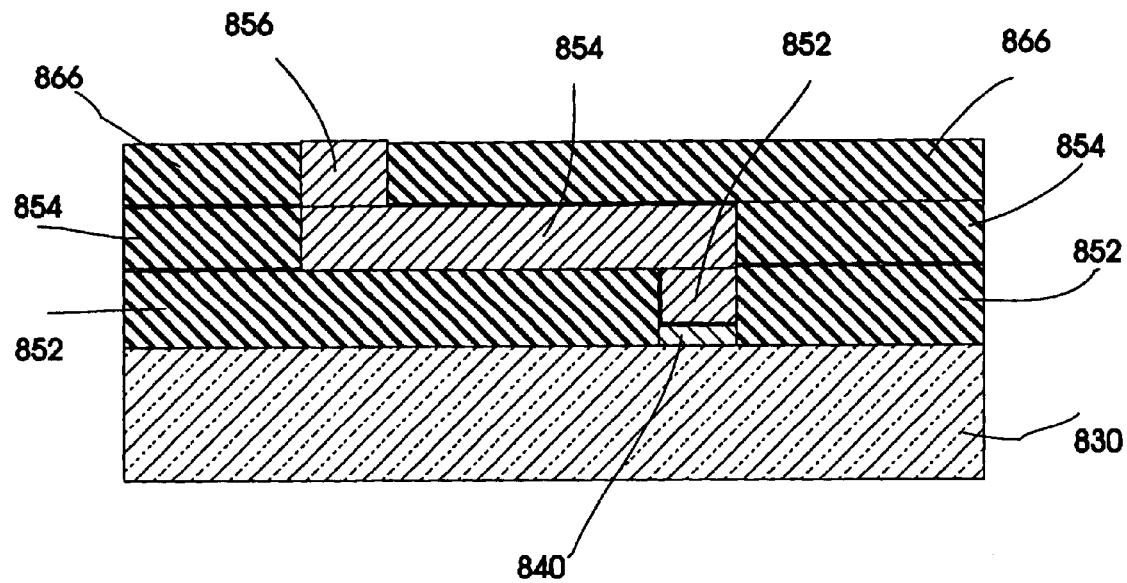
Figure 8D:
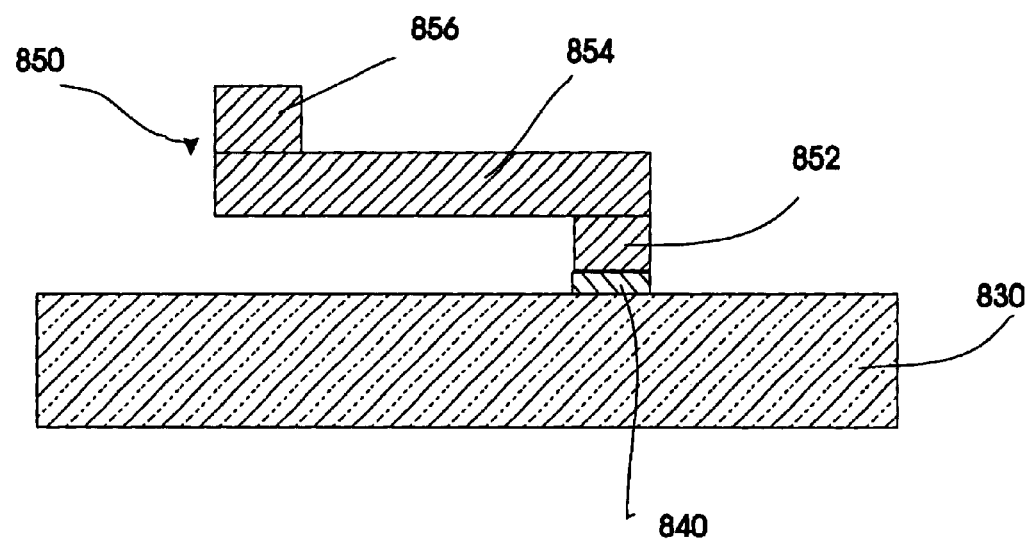

FIG. 8A–8D illustrate an example of a lithographically formed spring contact 850 in which distinct post 852, beam 854, and tip 856 portions are separately created. Typically, the post 852 is created by forming a first masking layer 862 on wafer 830 with an opening over terminal 840. The post portion 852 is then formed by filling the opening with a material suitable for the post as shown in FIG. 8A. Thereafter, a second masking layer 864 is formed over the first masking layer 862, defining an opening that includes the post 852 and defines the beam 854. The beam 854 is then created by filling the opening with a material suitable for the beam as shown in FIG. 8B. The process is then repeated with a third masking layer 866 defining the tip 856 as shown in FIG. 8C. Thereafter, the masking layers 862, 864, 866 are removed, leaving interconnect structure 850 attached to the terminal 840. It should be noted that a separate contact tip that is pointed or otherwise angled may be attached to the tip portion 856.

It should be noted that, rather than forming the interconnect elements 650, 750, 850 on the wafer 630, 730, 830, the interconnect elements may be formed separately from the wafer and, once formed, attached to the wafer so as to line up with terminals on dice composing the wafer. It should be apparent that the use of lithographic methods for forming interconnection elements on a wafer, such as the methods described above, allow for the placement of the interconnection elements in just about any location desired on the wafer and the formation of interconnection elements in just about any shape imaginable. Many exemplary techniques and processes for lithographically forming interconnection elements on a substrate, such as semiconductor wafer, and many exemplary interconnection elements shapes are described in the following U.S. patents and patent applications, all of which are incorporated herein by reference: U.S. patent application Ser. No. 08/819,464, filed Mar. 14, 1997; U.S. patent application Ser. No. 08/802,054, filed Feb. 18, 1997; U.S. Pat. No. 6,184,053; U.S. patent application Ser. No. 09/023,859, filed Feb. 13, 1998; U.S. patent application Ser. No. 09/032,473, filed Feb. 26, 1998; U.S. patent application Ser. No. 09/205,022, filed Dec. 2, 1998; U.S. patent application Ser. No. 09/205,023, filed Dec. 2, 1998; U.S. patent application Ser. No. 09/473,414, filed Dec. 28, 1999; U.S. patent application Ser. No. 09/474,788, filed Dec. 29, 1999; U.S. patent application Ser. No. 09/364,788, filed Jul. 30, 1999; U.S. patent application Ser. No. 09/547, 561, filed Apr. 12, 2000; U.S. patent application Ser. No. 09/710,539, filed Nov. 9, 2000; U.S. patent application Ser. No. 09/781,833, filed Feb. 12, 2001; U.S. patent application Ser. No. 09/795,772, filed Feb. 27, 2001; U.S. patent application Ser. No. 09/880,658, filed Jun. 13, 2001; and U.S. patent application Ser. No. 09/746,716, filed Dec. 22, 2000. Any such interconnection element may be used with the present invention. In addition, the physical and mechanical properties of such interconnection elements may be manipulated by including particular additives in the materials used to form the interconnection elements and/or by heat treating as described above.

FIGS. 3A–4B thus illustrate an exemplary implementation of step 204 of FIG. 2 (forming interconnect elements on the wafer), and FIGS. 5A–8D illustrate exemplary interconnection elements that may be formed on the wafer. FIGS. 9A–10B illustrate another exemplary implementation of step 204 of FIG. 2. As with the implementation illustrated in FIGS. 3A–4B, any elongate interconnect element may be utilized in the examples shown in FIGS. 9A–10B, including but not limited to elongate interconnect elements formed in accordance with the processes illustrated in FIGS. 5A–8D.

Figure 9A:
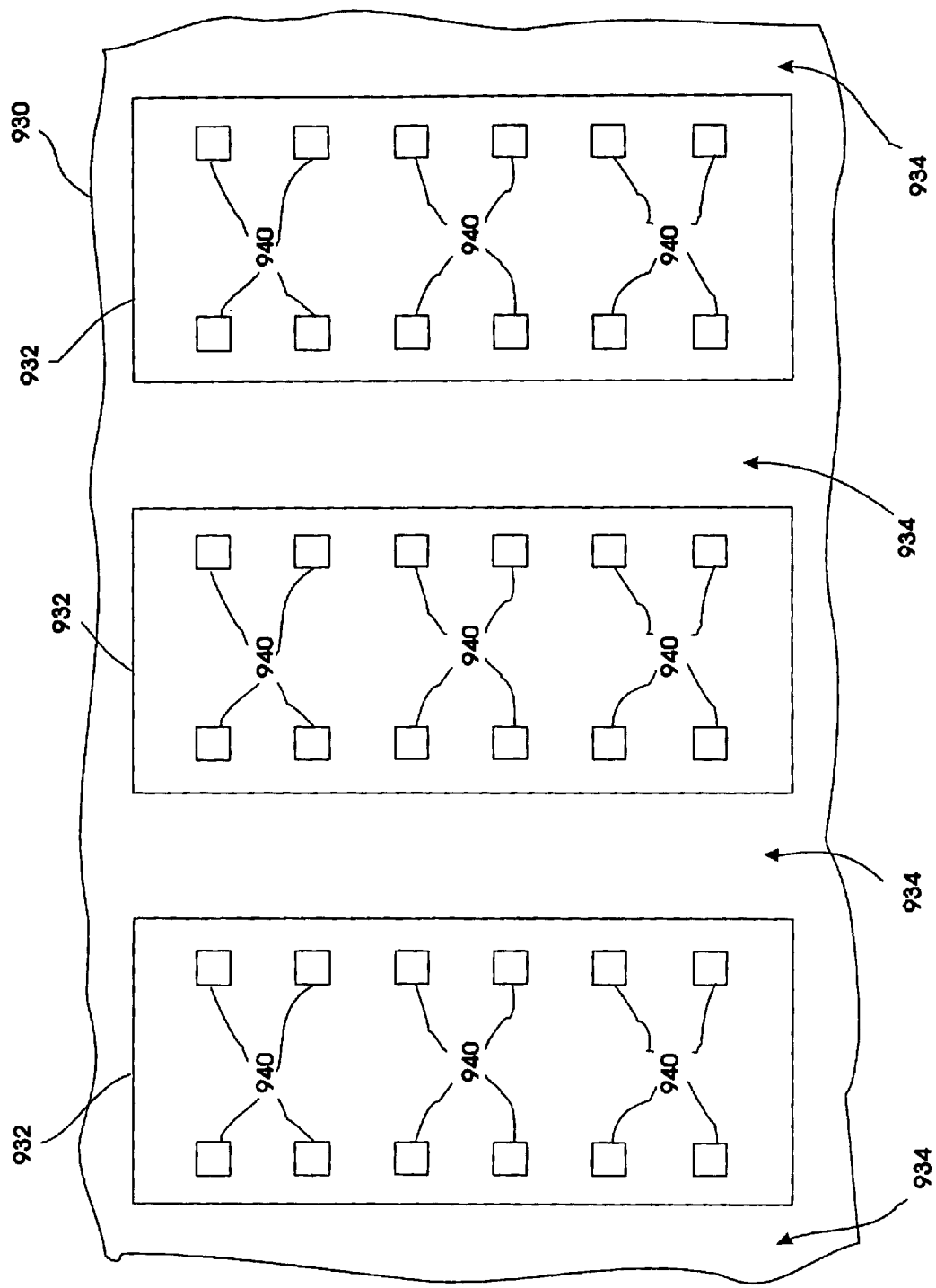
FIG. 9A is a top view of a portion of an unsingulated wafer showing three exemplary dice.

FIG. 9A, like FIG. 3A, illustrates a portion of a semiconductor wafer 930 having three adjacent dice 932. The wafer 930 may be similar or identical to the wafer described above with respect to FIG. 3A. This wafer 930 is provided with semiconductor devices (dice) formed thereon as per step 202 in FIG. 2 above. As mentioned above, FIG. 9A illustrates only three 932 of many such dice. Scribe streets 934 provide space between adjacent dice 932 that allows the wafer to be singulated into individual dice.

Figure 9B:
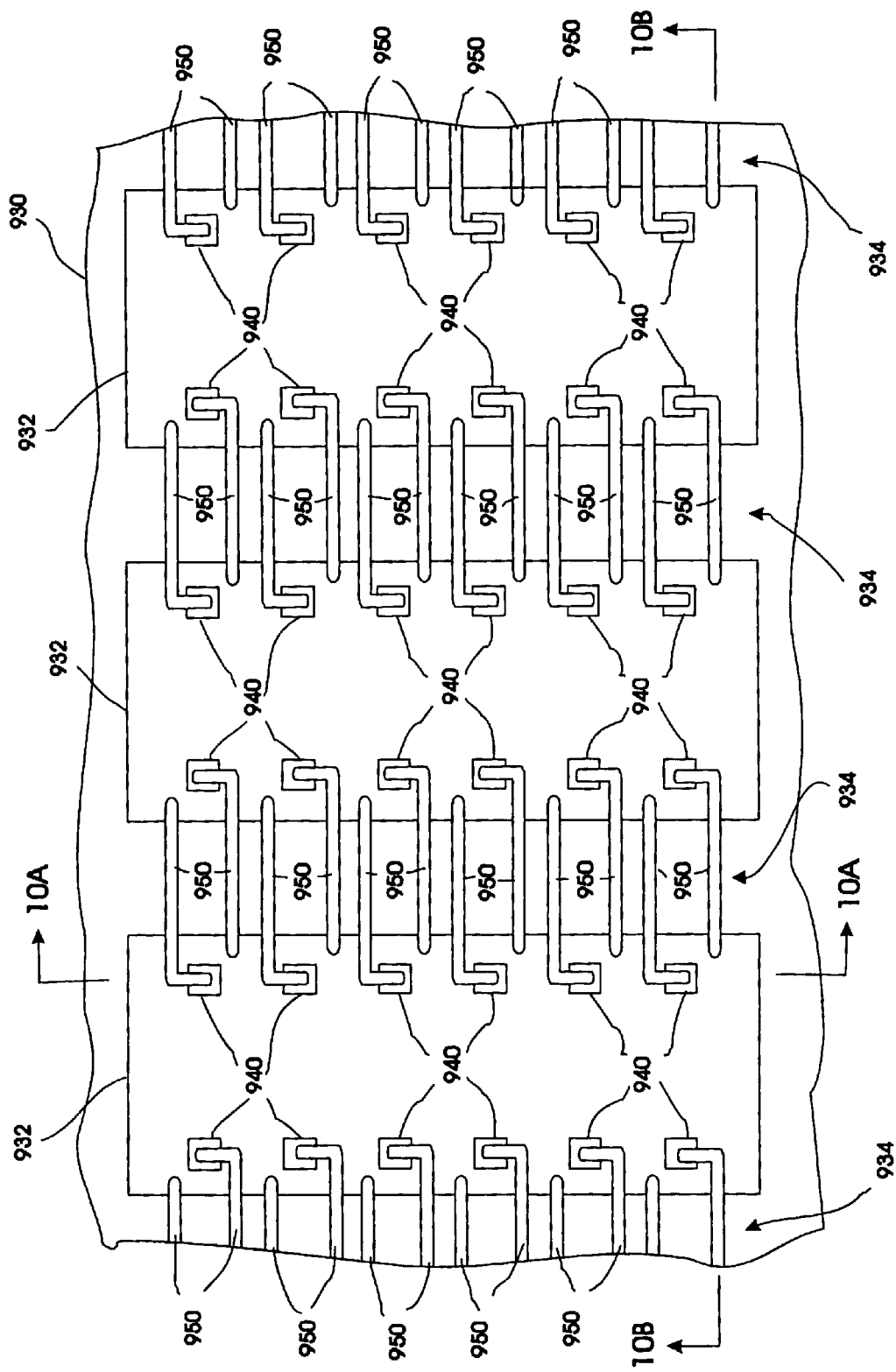
FIG. 9B is a top view of the wafer of FIG. 9A showing interconnect elements attached thereto.
Figure 10A:
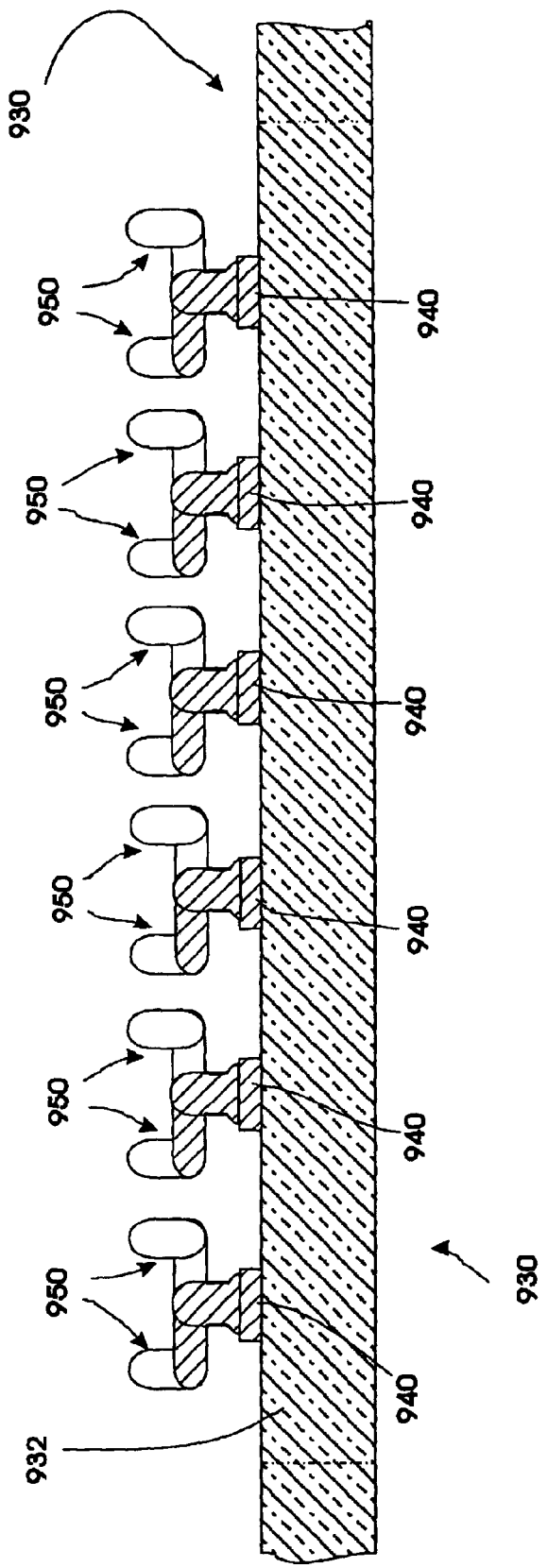
FIGS. 10A and 10B are side cross-sectional views of the wafer of FIG. 9B.
Figure 10B:
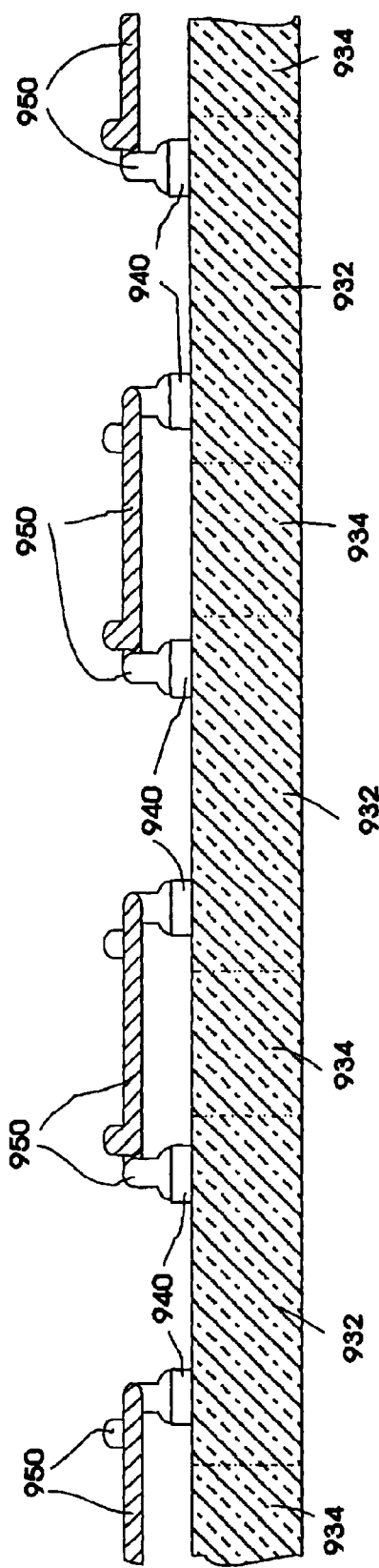

As shown in FIGS. 9B, 10A, and 10B, interconnect elements 950 are formed on terminals 940 as per step 204 of FIG. 2. (FIG. 9B illustrates a top view of the wafer 930; FIG. 10A illustrates a cross-sectional view of a die 932 taken through one of its vertical columns of terminals 940, as indicated in FIG. 9B; and FIG. 10B illustrates a cross-sectional view of the dice 932 taken through a horizontal line through the three dice 932, as also indicated in FIG. 9B.) As also shown, the interconnect elements 950 are arranged to interleave with interconnect elements attached to terminals on a neighboring die. Note that, in the example illustrated in FIG. 9B, the each interconnect element 950 extends from a terminal 940 to which it is attached across a scribe street 934 and into the boundary of a neighboring die 932. Thus, in this example, the interconnect elements 950 overhand space above a neighboring die 332.

Figure 11A:
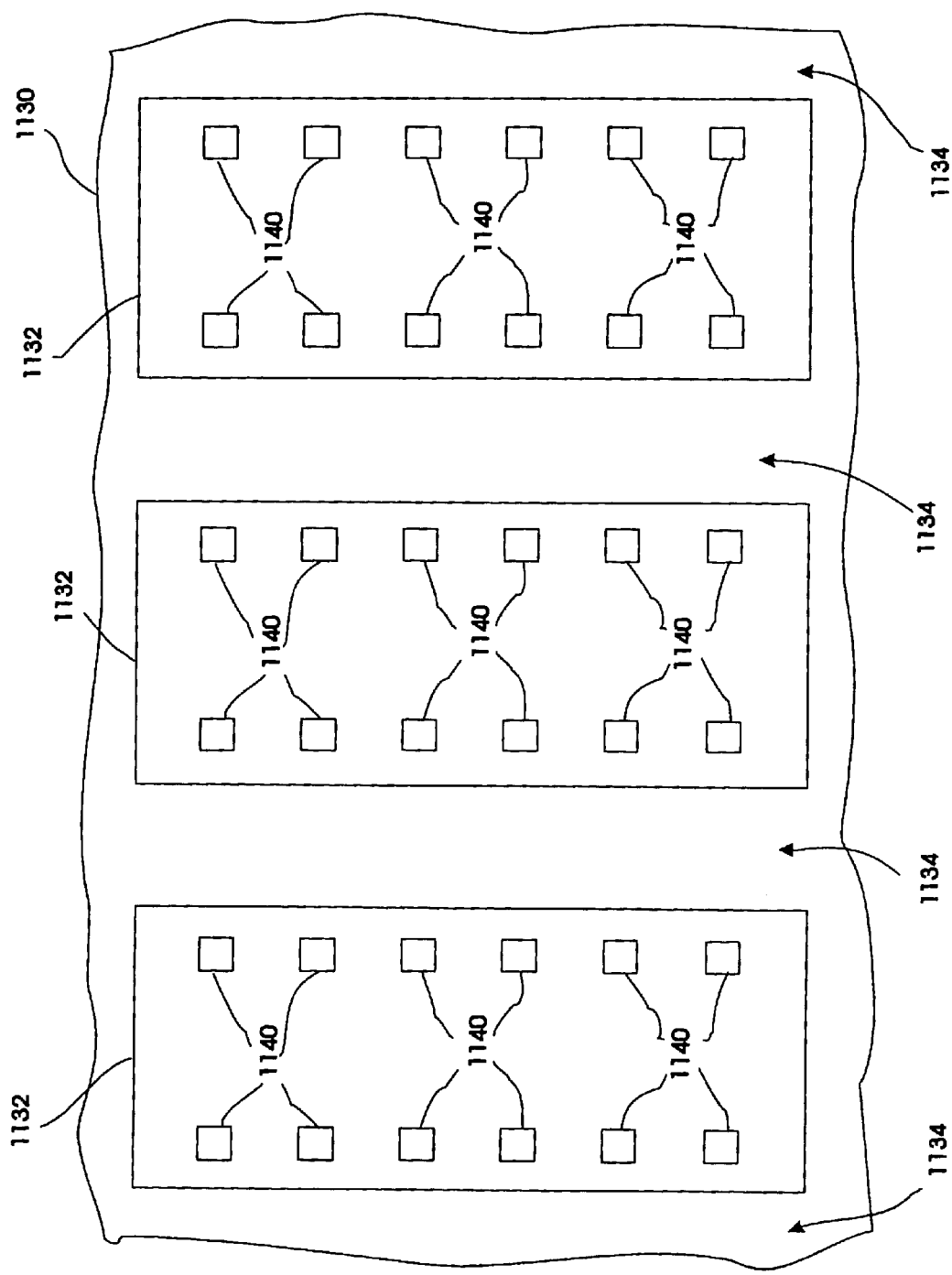
FIG. 11A is a top view of a portion of an unsingulated wafer showing three exemplary dice.
Figure 11B:
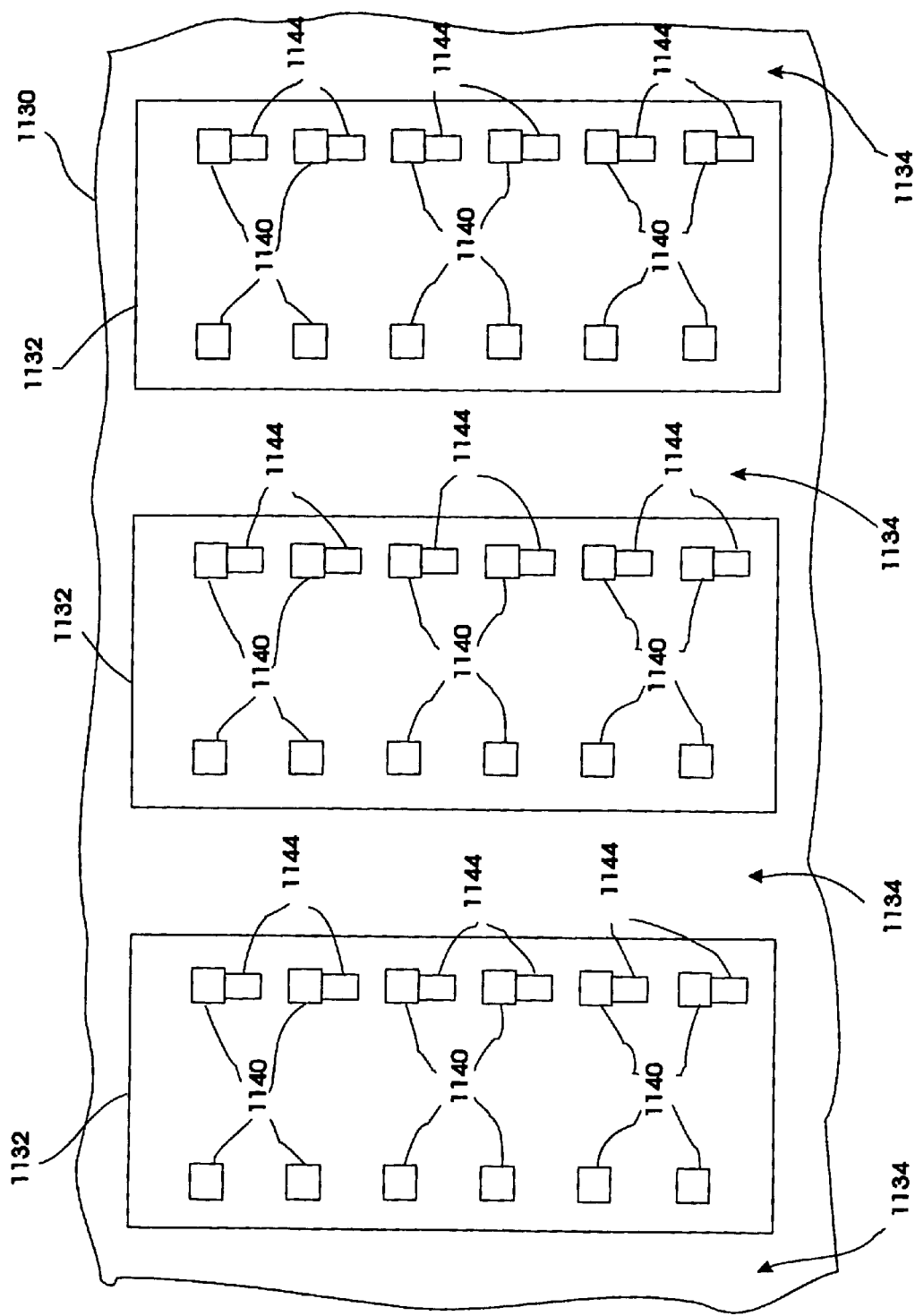
FIGS. 11B and 11C are top views of the wafer of FIG. 11A showing, respectively, conductive traces and interconnect elements attached thereto.
Figure 11C:
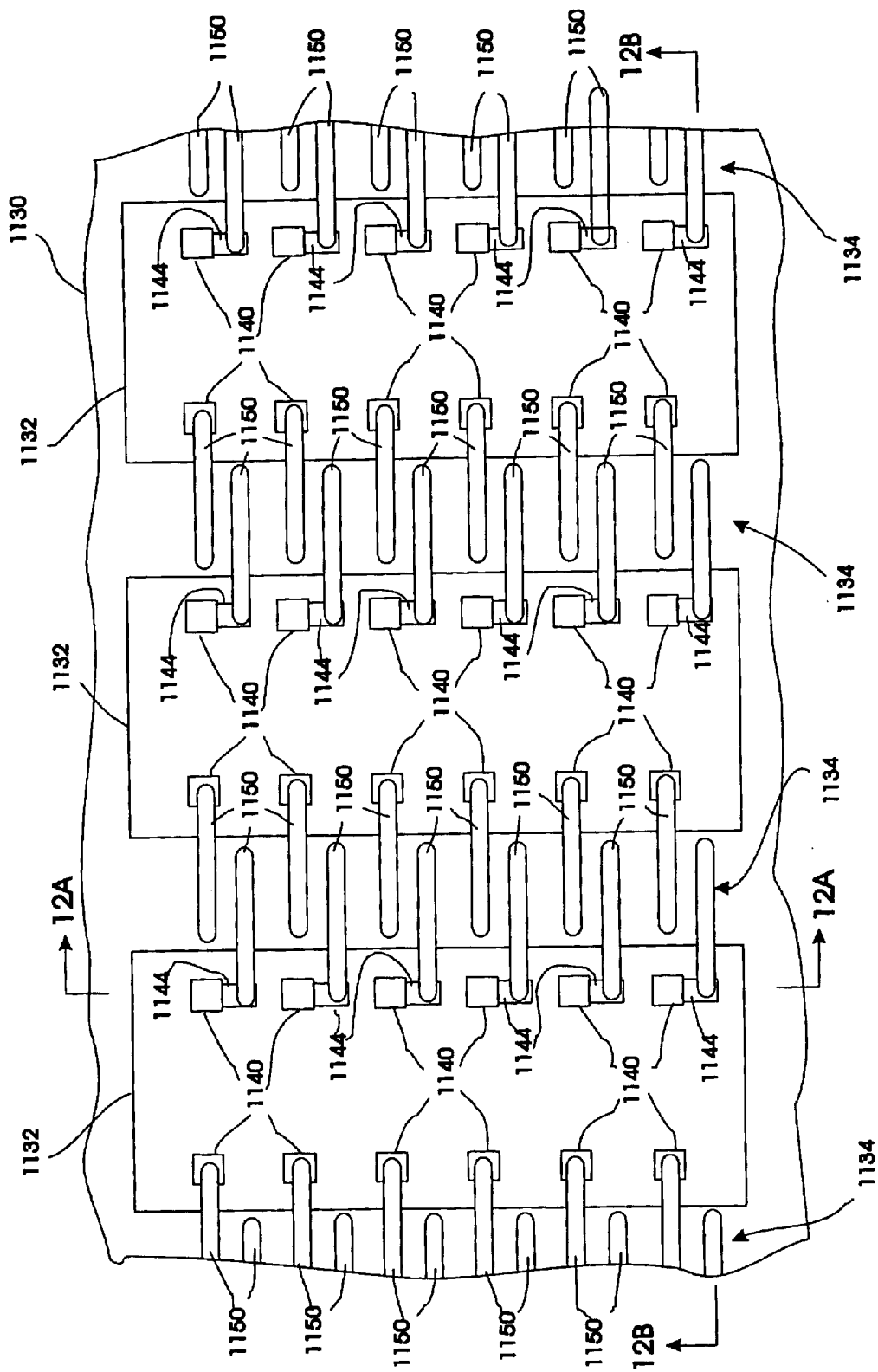
Figure 12A:
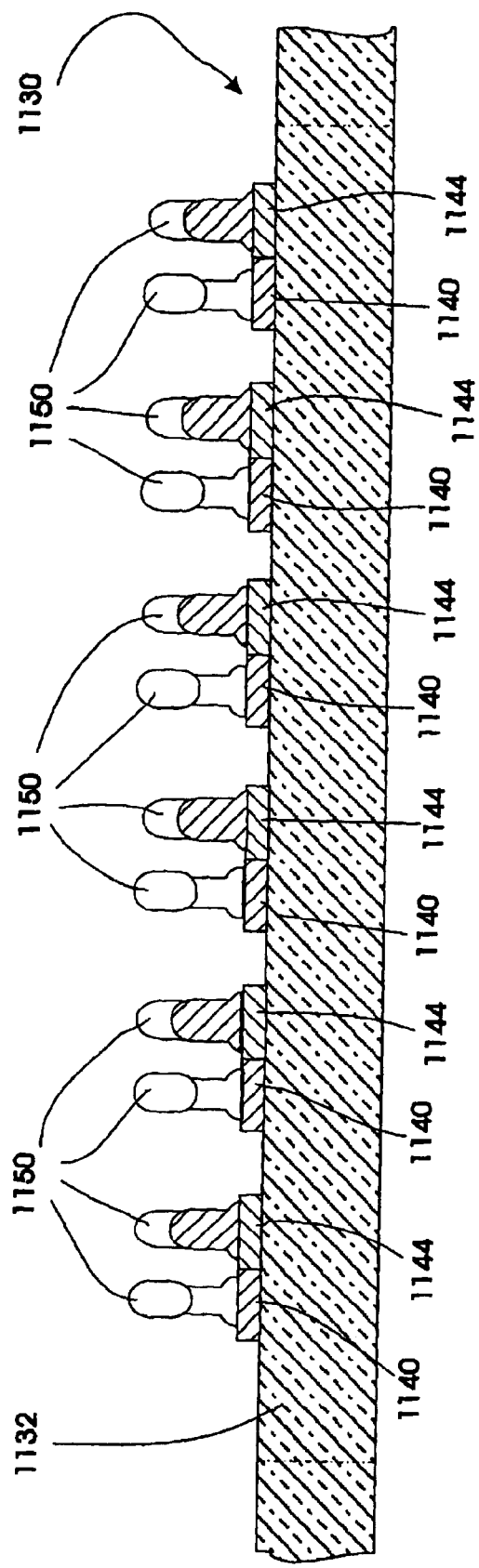
FIGS. 12A and 12B are side cross-sectional views of the wafer of FIG. 11C.
Figure 12B:
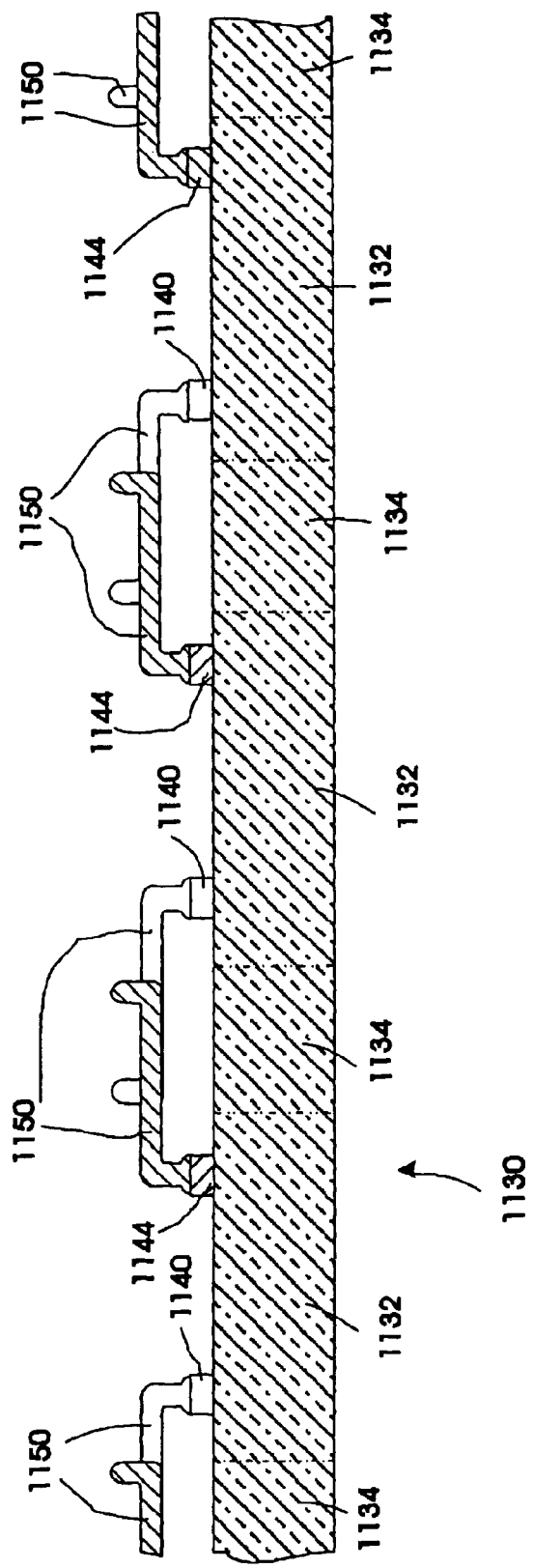

FIGS. 11A–12B illustrate yet another exemplary way of performing the step of forming interconnect elements on terminals of the wafer, which is step 204 of FIG. 2. (FIGS. 11A–C illustrate top views of a wafer 1130; FIG. 12A illustrates a cross-sectional view of a die 1132 taken through one of its vertical columns of terminals 1140, as indicated in FIG. 12C; and FIG. 12B illustrates a cross-sectional view of the dice 1132 taken through a horizontal line through the three dice 1132, as also indicated in FIG. 11C.) Like FIGS. 3A and 9A, FIG. 11A illustrates a portion of an exemplary wafer 1130 that may be provided in step 202 of the process illustrated in FIG. 2. The exemplary wafer 1130 may be similar or identical to the wafer 330 illustrated in FIG. 3A. Again, three dice 1132 are illustrated, each having a plurality of terminals 1140 and being separated from each other by scribe streets 1134.

In this example, the process of forming interconnect elements on terminals 1140 begins with forming conductive traces 1144 on the surface of the dice 1132 as shown in FIG. 11B. Each conductive trace 1144 is electrically connected to a die terminal 1140. As shown in FIG. 11C, the conductive traces 1144 provide a location offset from terminals on an adjacent die 332 for interconnect elements 1150. That is, along the right edge of a die 332, interconnect elements 1150 are formed on the conductive traces 1144. Along the left edge of the die 1132, however, interconnect elements 1150 are formed on the terminals 1140. This allows the interconnect elements 1150 on neighboring dice 1132 to be interleaved so that they do not interfere with each other.

It should be apparent that the conductive traces 1144 perform a "redistribution" function. That is, in essence, they move or redistribute the locations of connection terminals into and out of the dice. It should be noted that an initial layer of insulative material may be applied to the surface of each die prior to forming the conductive traces 1144. Openings in the material would be left over terminals 1140, and the conductive traces would then be formed by filling such openings and then forming the conductive traces on the insulative material. It should also be apparent that multiple layers of insulative material and multiple layers of conductive material may be formed on a die so as to form complex redistribution of the connection terminals.

Figure 13A:
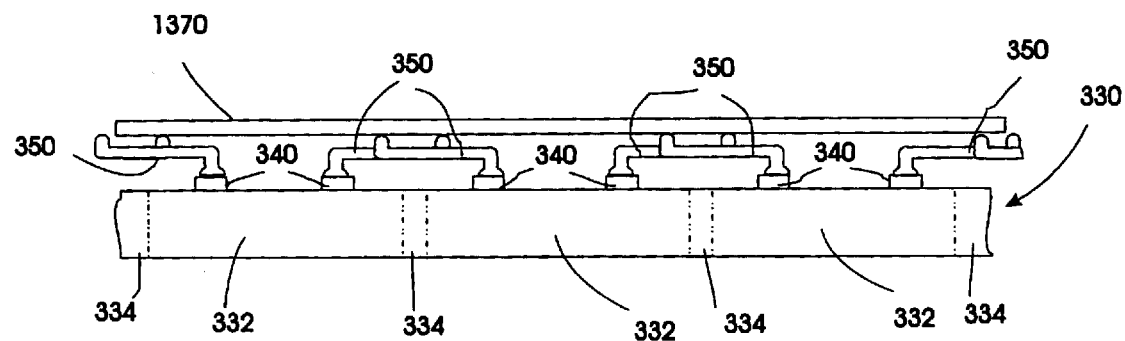
FIGS. 13A–13C, 14A–14E, 15A–15D, and 16A–16E show side views of exemplary wafers undergoing singulation processes.
Figure 13B:
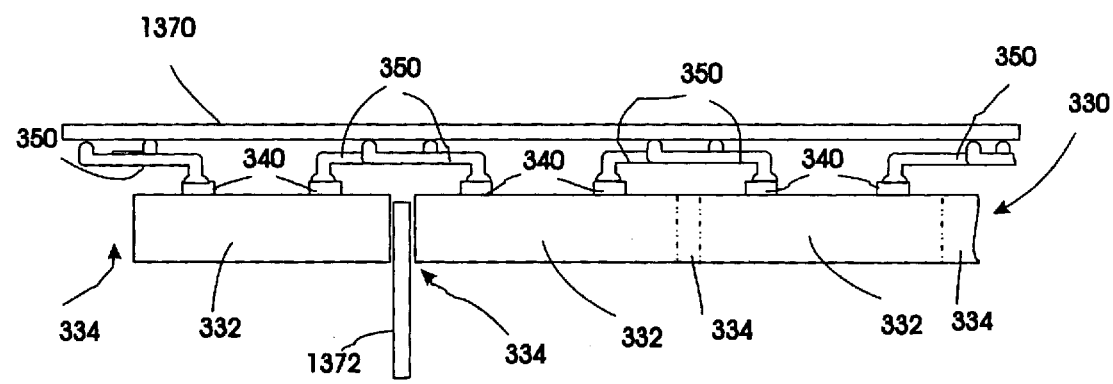
Figure 13C:
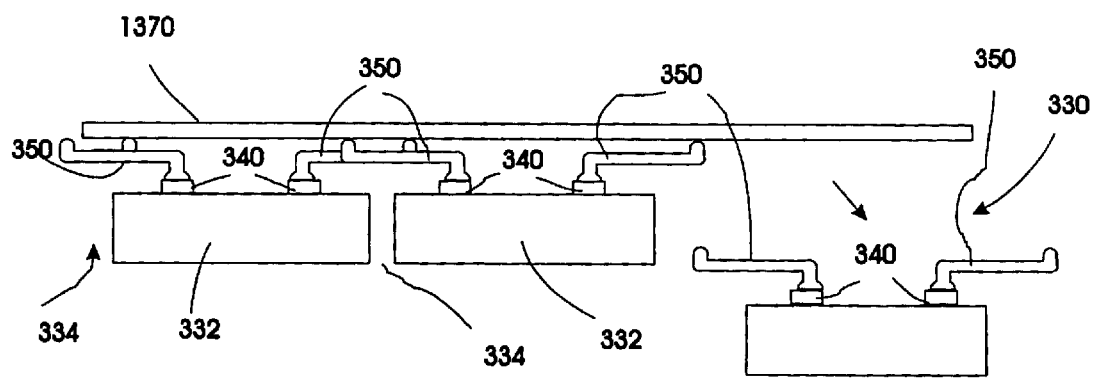

Referring again to FIG. 2, once the interconnection elements have been formed on the wafer at step 204, the wafer is singulated into individual dice at step 206. FIGS. 13A–13C illustrate an exemplary method for singulating the wafer into individual dice. For ease of discussion, the exemplary wafer 330 illustrated in FIGS. 3B–4B is the exemplary wafer shown in FIGS. 13A–13C.

As illustrated in FIGS. 13A–13C, once interconnection elements 350 have been formed on the wafer 330 at step 204 (referring to FIG. 2), the semiconductor wafer 330—in particular, the tips of the interconnect elements 350—is pressed against a fixative 1370 such that the tips of the interconnect elements 350 adhere to the fixative 1370. The fixative 1370 preferably is a layer of adhesive tape to which the interconnect elements 350 will adhere, but other materials to which the interconnect elements will adhere may also be used, e.g., silicon gels. Such a tape is preferably debondable. Nonexclusive examples of such a tape include an organic, metallic, or ceramic material attached to an adhesive layer.

Once the wafer 330 is adhered to the fixative 1370, the silicon wafer 330 is diced or singulated as shown in FIG. 13B. This may be done using any suitable method of dicing or singulating a wafer. For example, a dicing blade or saw 1372, or a laser (not illustrated), may be used to cut along the scribe streets 334, separating the semiconductor wafer 330 into individual dice 332. As another example, the wafer may be "scribed" (not illustrated) along the scribe streets before being adhered to the fixative, using a scribing or scoring implement, and then fractured along the scribed lines as is known in the art.

Notably, as illustrated in FIG. 13B, when a cutting implement such as a dicing blade or dicing saw 1372 is used to singulate the semiconductor wafer 330, the depth of cutting is controlled carefully such that the dicing blade or dicing saw 1370 breaks through the side of the semiconductor wafer 330 opposite to the side from which the tool is applied to the semiconductor wafer (i.e., the side of the wafer 330 on which the interconnect elements 350 are disposed) but stops short of contacting the interconnect elements. If, on the other hand, the semiconductor wafer 330 is singulated using a suitable laser to cut through the semiconductor wafer, it is believed that the laser beam is able to cut through the semiconductor wafer while leaving the interconnect elements 350 unharmed.

Once the wafer 330 has been singulated, the individual dice 332 are lifted away from the fixative 1370 as shown in FIG. 13C. The removal of dice 332 may be done manually or, in an automated process, by suitably designed chip-handling machinery. As suggested by FIG. 13C, if the interconnection elements 350 are interleaved, it may be preferable for the individual dice 332 to be removed from the fixative 1370 in order, beginning from one side or edge of the arrangement of separated dice 332 and moving sequentially across the array or arrangement. Of course, this is not essential to the present invention.

Figure 14A:
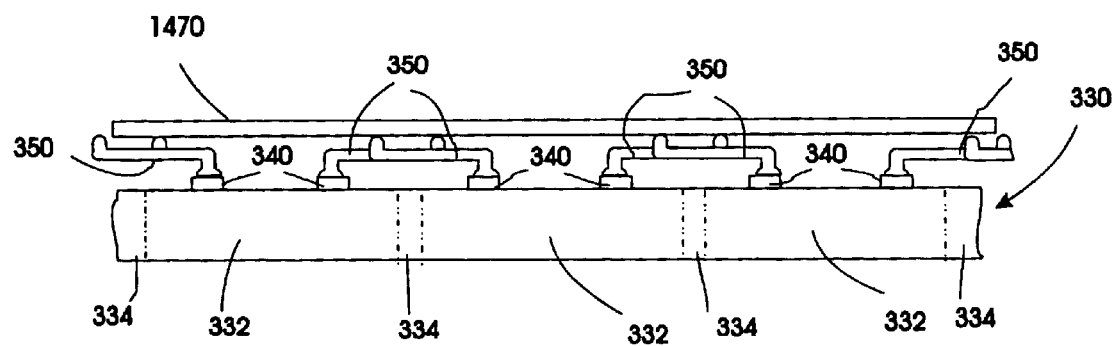
Figure 14B:
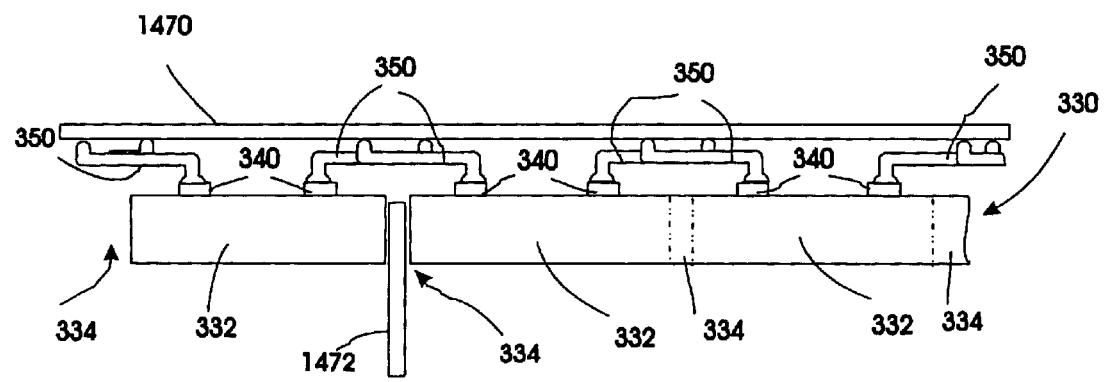
Figure 14C:
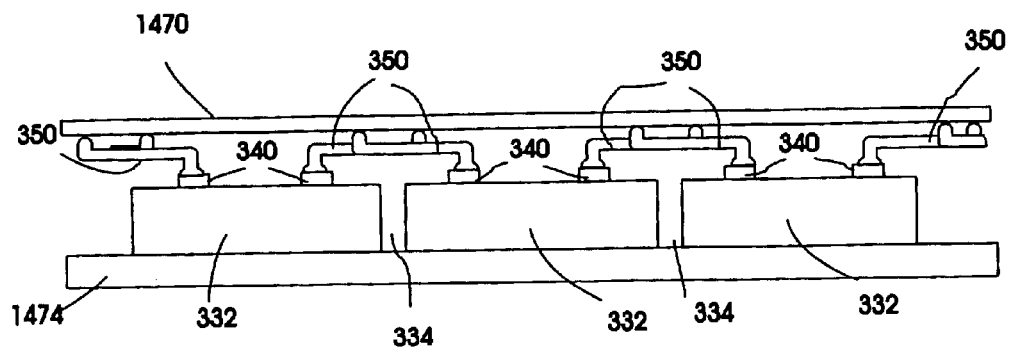
Figure 14D:
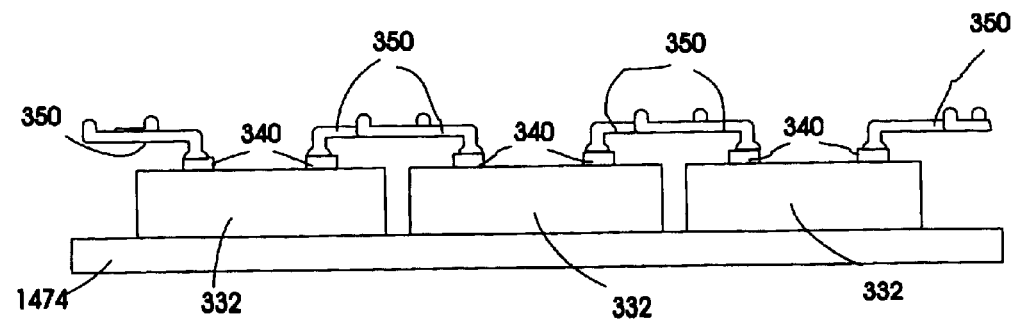
Figure 14E:
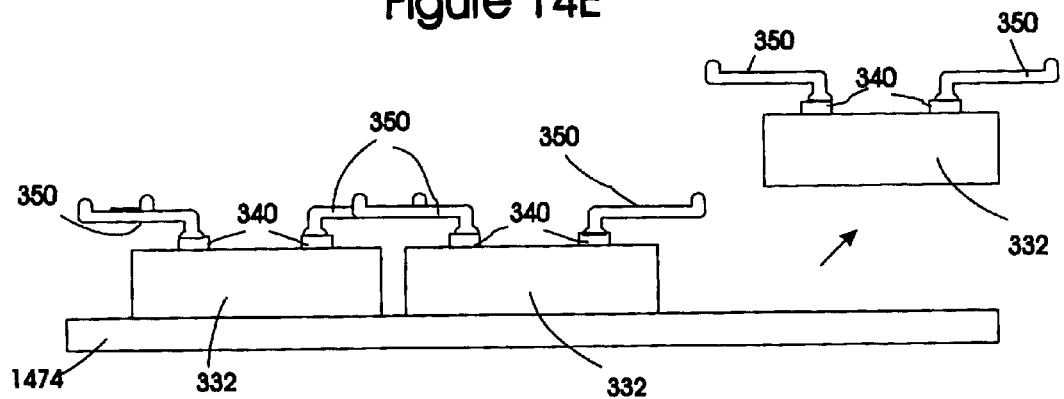

FIGS. 14A–14D illustrate another exemplary method for singulating the wafer into individual dice. Again, for ease of discussion, the exemplary wafer 330 illustrated in FIGS. 14A–14D is the wafer shown in FIGS. 3B, 4A, and 4B. The steps illustrated in FIGS. 14A and 14B may be similar or identical to the steps illustrated in FIGS. 13A and 13B, respectively. Once the wafer 330 has been singulated as shown in the step illustrated in FIG. 14B, a second fixative layer 1474, e.g., a layer of adhesive tape that may be the same as or different from the adhesive tape constituting fixative 1470, may be applied to the singulated dice 1432 opposite the interconnect elements 350, as shown in FIG. 14C. The first fixative layer 1470 may be removed from the tips of the interconnect elements 350 to which it is adhered. The array of singulated dice 332 may then be transported en masse as attached to the second fixative layer 1474, or they may be removed from the second fixative layer 1474, if so desired, which may be in sequential fashion as described above with respect to FIG. 13C and shown in FIG. 14E.

Figure 15A:
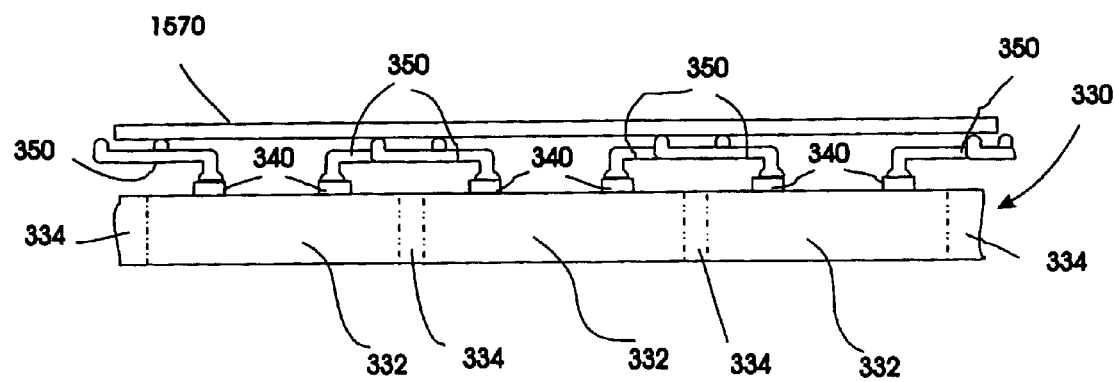
Figure 15B:
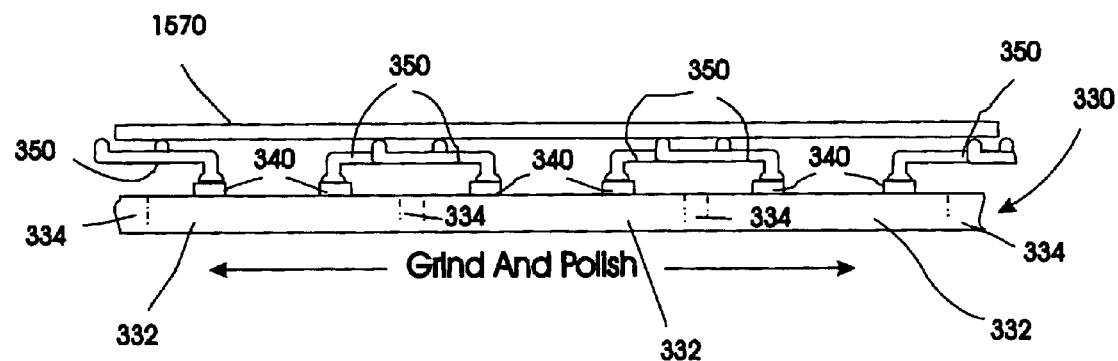

FIGS. 15A–15D illustrate yet another exemplary method for singulating the wafer into individual dice. Again, for ease of discussion, the exemplary wafer 330 illustrated in FIGS. 15A–15D is the exemplary wafer shown in FIGS. 3B, 4A, and 4B. As shown in FIG. 15A, the wafer 330 is adhered to a fixative 1570. As illustrated in FIG. 15B, the back of the wafer 330 is then ground and/or polished to reduce its thickness. A preferred grinding and polishing method is referred to generically as atmospheric downstream plasma etching of silicon.

Figure 15C:
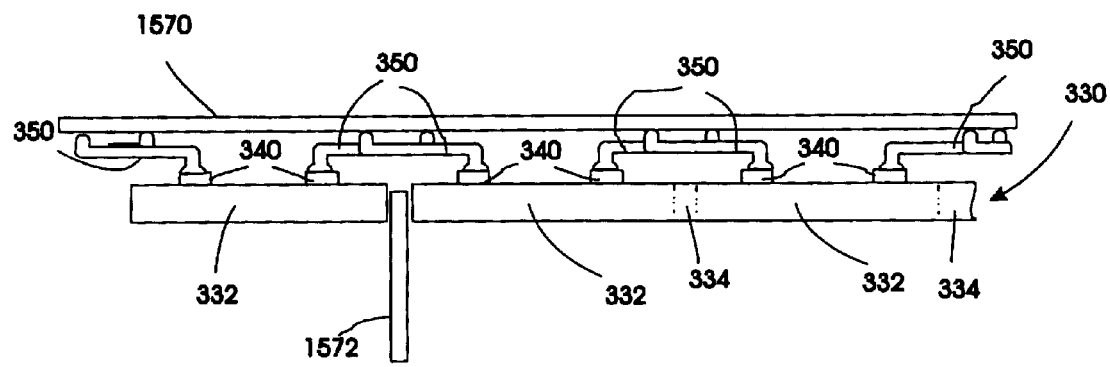
Figure 15D:
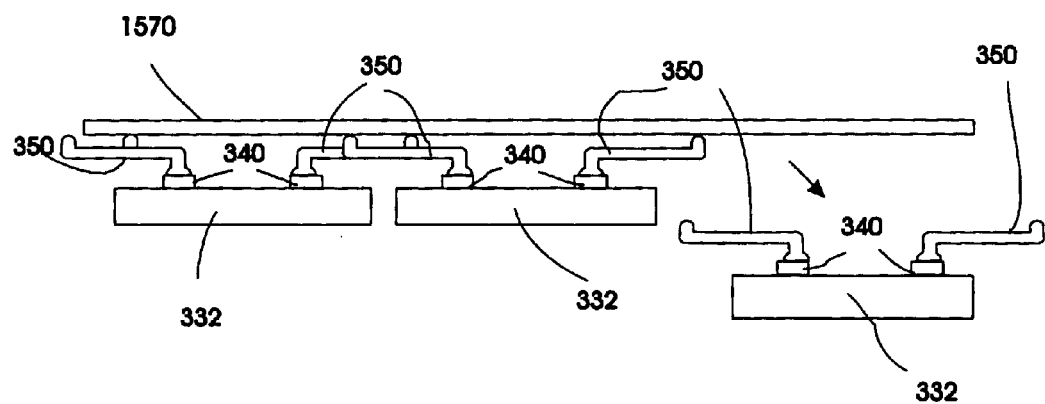

Subsequently, the semiconductor wafer is singulated, as illustrated in FIG. 15C. This may be accomplished as described above with reference to FIGS. 13B and 14B, and the individual, dice 332 may be removed from the fixative 1570, as illustrated in FIG. 15D, which may be accomplished in the same manner as described above with reference to FIG. 13C. Alternatively, if so desired, rather than removing the individual, dice 332 from the fixative 1570 as illustrated in FIG. 15D, a second fixative layer (not shown) may be applied to the individual semiconductor dice 332 in a manner analogous to the second fixative layer 1474 of FIGS. 14A–14E. The first fixative 1570 may then be removed, with the dice 332 subsequently being removed from the second fixative layer in a manner analogous to the steps illustrated in FIGS. 14D and 14E.

Figure 16A:
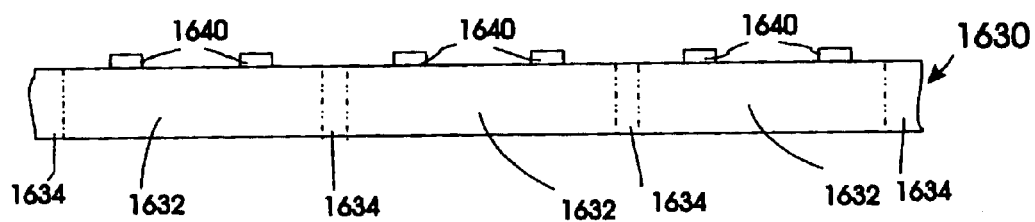
Figure 16B:
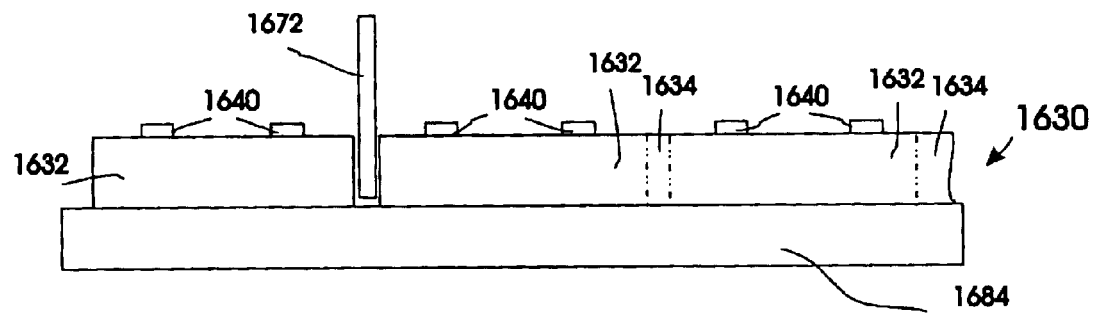
Figure 16C:
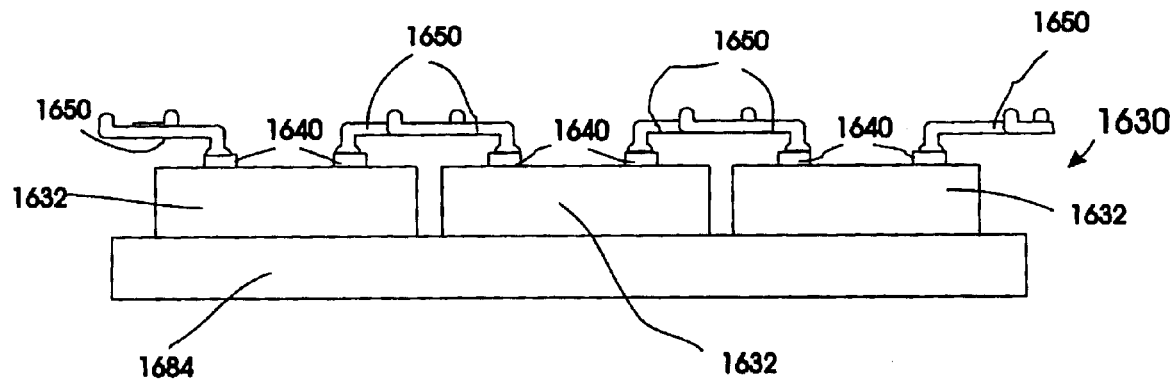
Figure 16D:
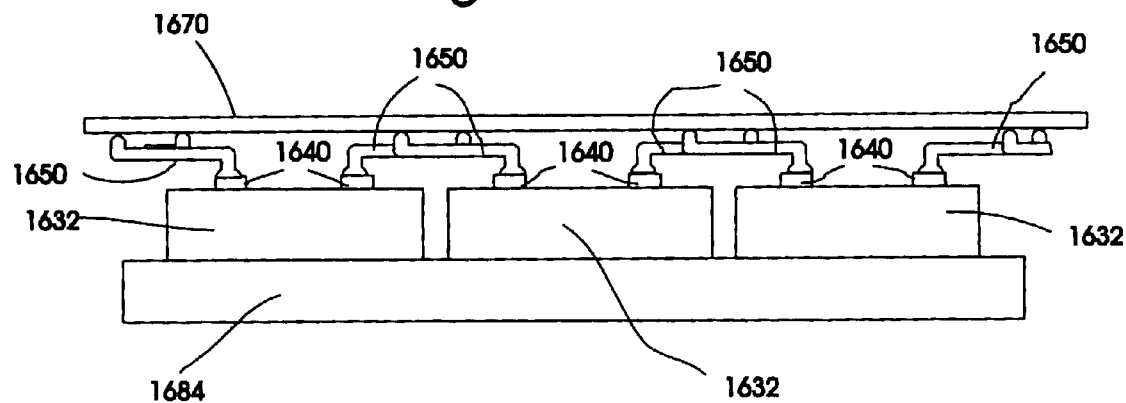
Figure 16E:
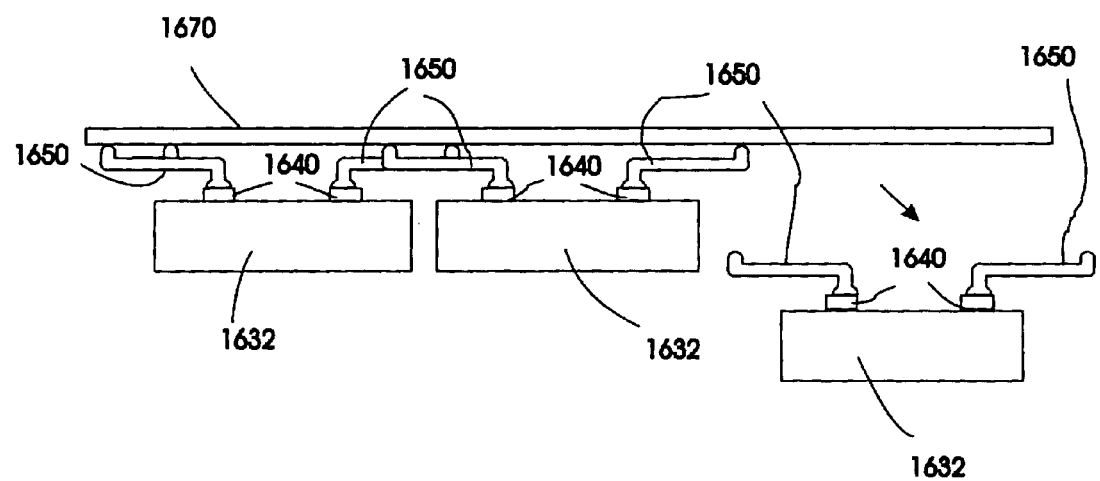

FIGS. 16A–16F illustrate an alternative process to the process shown in FIG. 2 in which a semiconductor wafer 1630 is diced or singulated before interconnect elements are attached to the wafer. FIG. 16A shows a partial side view of a wafer 1630 that may be the same as or similar to the wafers illustrated in FIGS. 1, 3A, 9A, and/or 11A. As shown in FIG. 16B, a backing layer 1684 is applied to the back of the wafer 1630. The backing layer 1684 is preferably debondable. For example, the backing layer 1684 may be made of an organic, metallic, or ceramic substrate with an adhesive layer. The wafer 1630 is then singulated, e.g., using a dicing blade or dicing saw 1672 as illustrated in FIG. 16B. Interconnect elements 1650 are then formed on terminals 340 as shown in FIG. 16C. The singulated wafer 1630, held together by means of the backing layer 1684, is then adhered to a fixative 1670 as illustrated in FIG. 16D. The backing layer 1684 is then removed and the individual dice 1632 are removed from fixative 1670 as illustrated in FIG. 16E.

It should be apparent that the steps illustrated in FIGS. 16D and 16E are not necessary. That is, interconnect elements 1650 are formed on dice 1632 in the step illustrated in FIG. 16C, the dice 1632 could simply be removed from fixative 1684, and the steps illustrated in FIGS. 16D and 16E skipped.

Figure 17A:
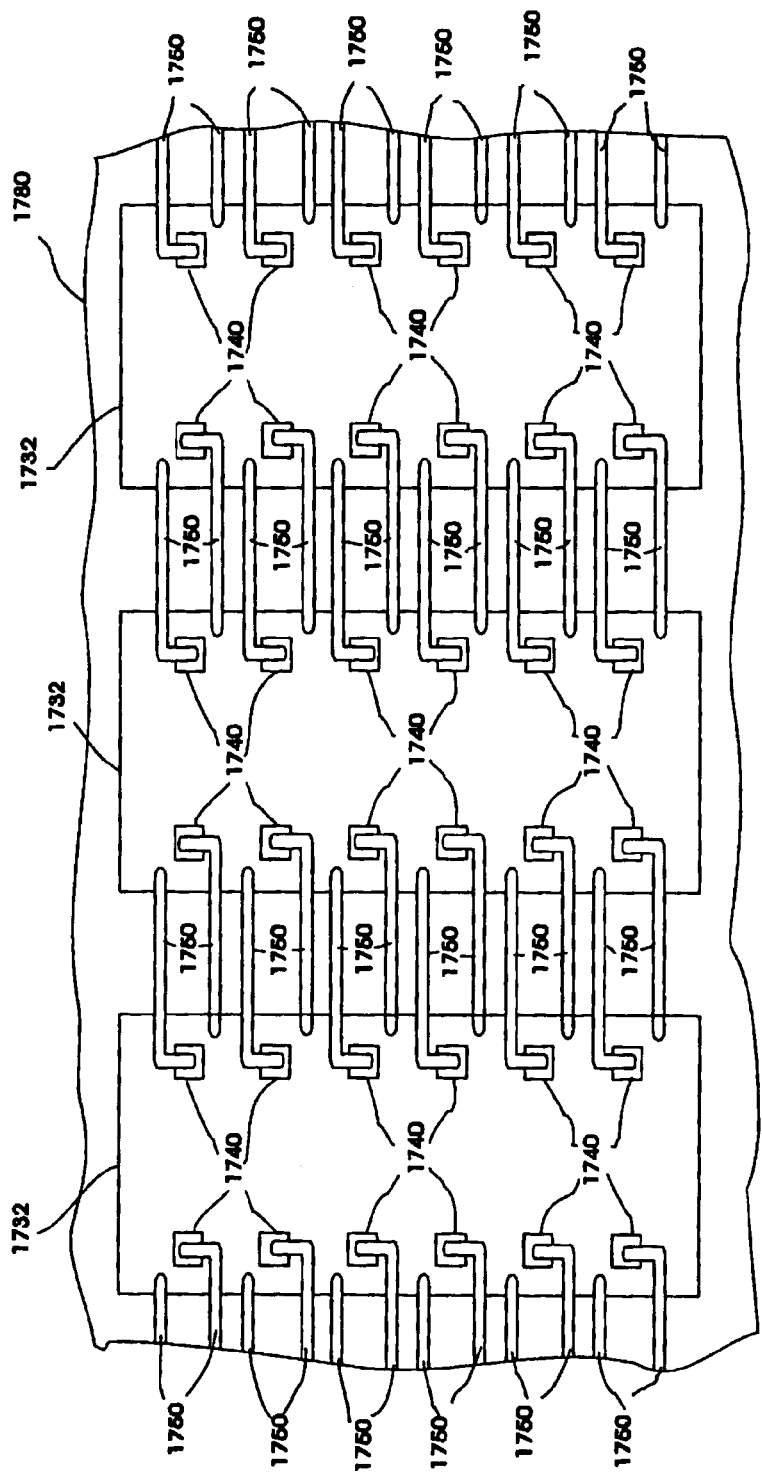
FIGS. 17A and 17B are top views of three dice from a singulated wafer attached to a stretchy membrane.
Figure 17B:
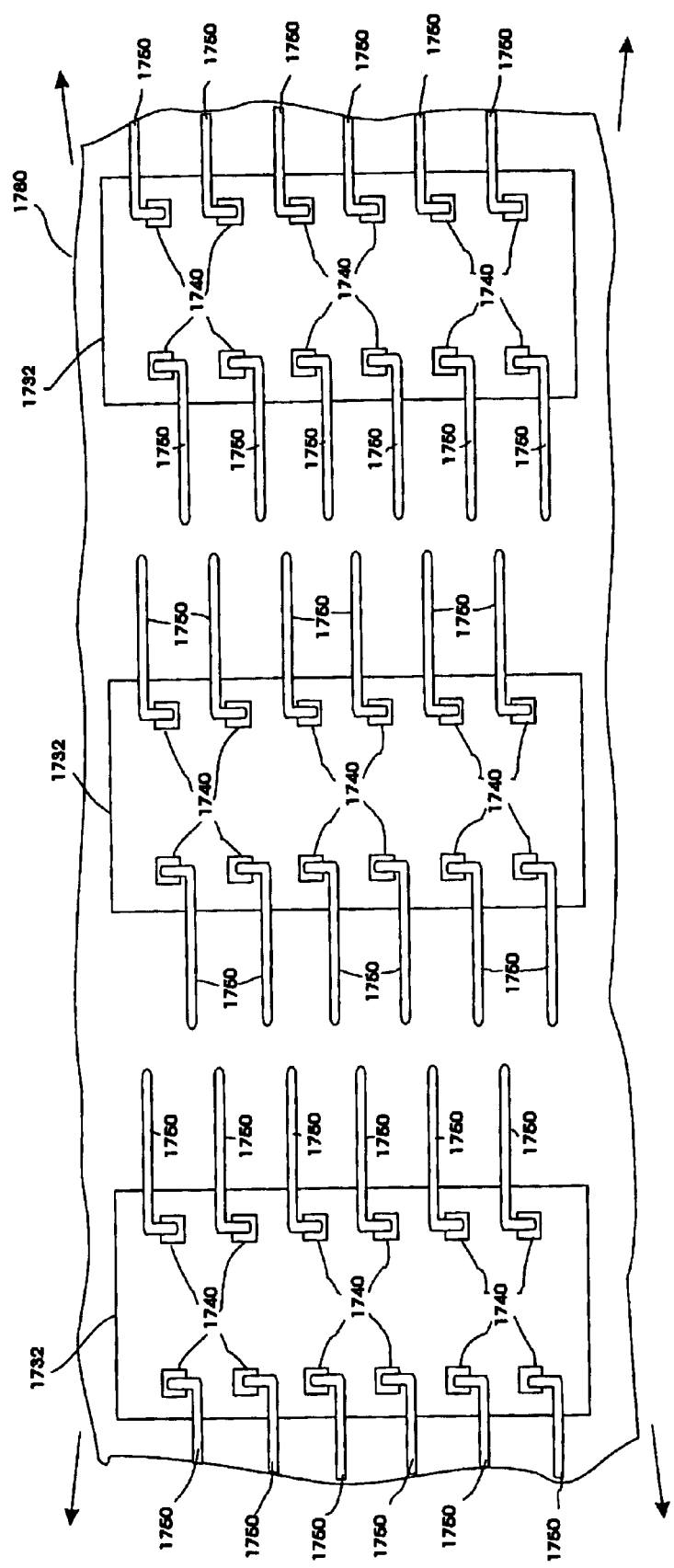

A stretchy membrane or material may optionally be used with any of the processes for singulating the wafer illustrated in FIGS. 13A through 16E to aid in the removal of singulated dice. In any of those processes, before removing singulated dice 332, 1632 from the adhesive layer 1370, 1470, 1570, 1670 in steps 13C, 14D, 15D, or 16F, a stretchable material may be applied to the surface of the wafer opposite the adhesive layer. Thereafter, the adhesive layer is removed, the stretchable material is stretched, and the dice are removed from the stretchable material. FIG. 17A illustrates an example in which a stretchable material 1780 has been applied to singulated dice 1732, each having interconnect elements 1750 formed on terminals 1740. As shown in FIG. 17B, the stretchable material 1780 is stretched, moving the singulated dice 1732 away from each other. The greater space between singulated dice 1732 makes it easer to pick and remove individual die 1732.

Figure 18A:
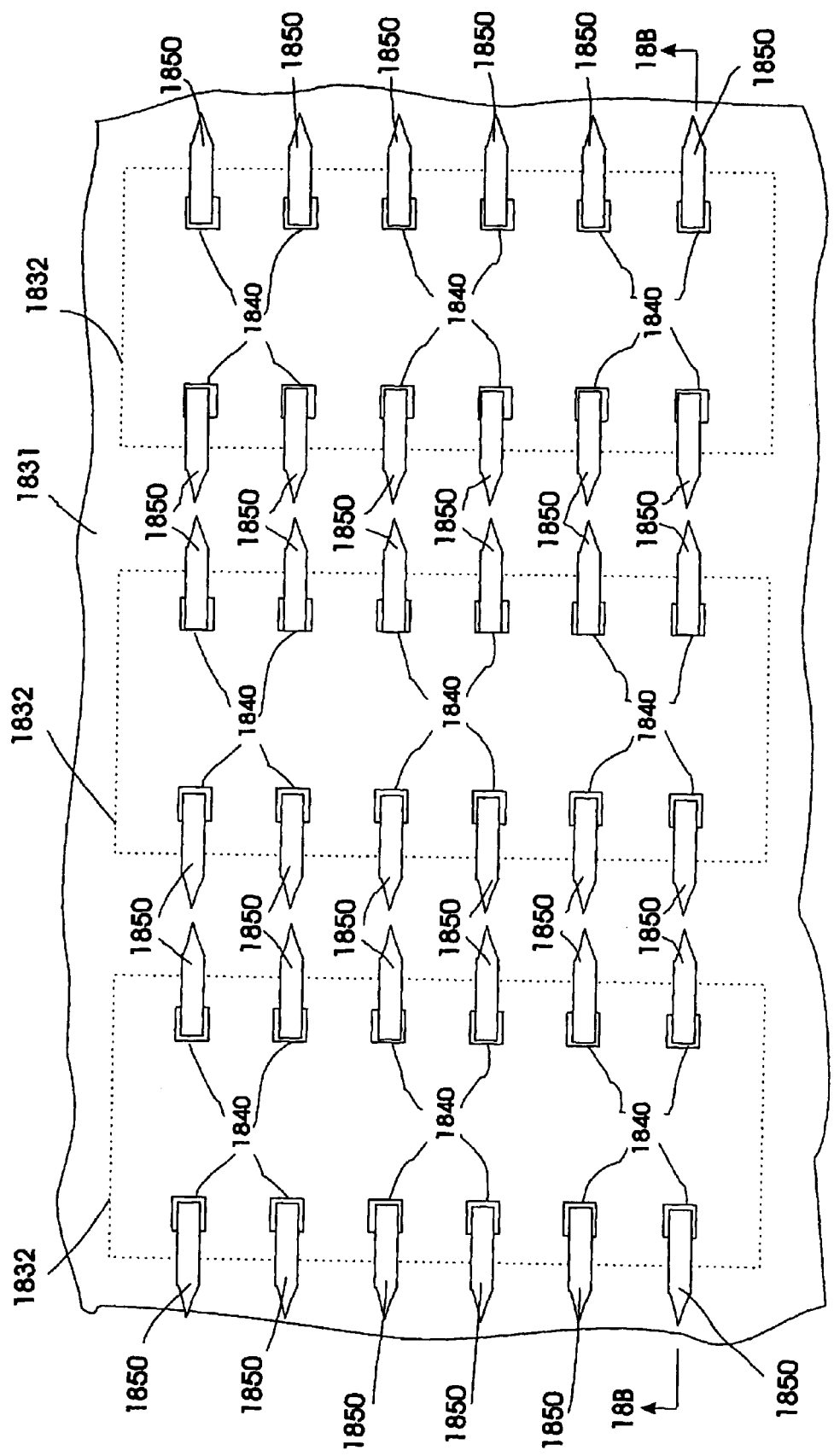
FIG. 18A is a top view of a portion of an unsingulated wafer showing three exemplary dice.
Figure 18B:
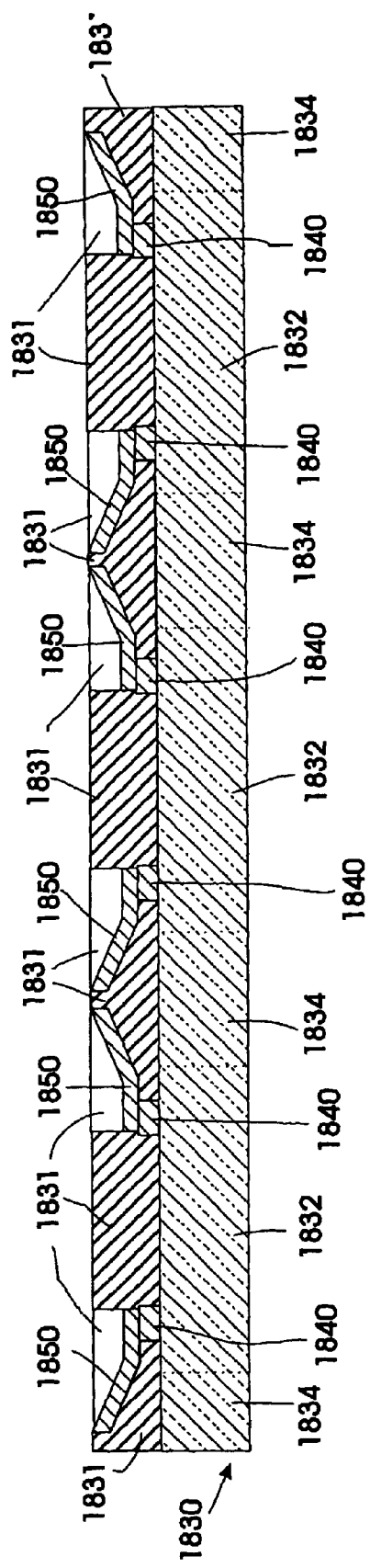
FIG. 18B is a side cross-sectional view of the wafer of FIG. 18A.

FIGS. 18A and 18B illustrate yet another exemplary method of singulating a wafer on which have been formed contact elements that extend beyond the boundary of dice on the wafer. In FIGS. 18A and 18B, contact elements 1850 have been formed be depositing (e.g., by electroplating) a metallic conductor on a pattern formed in photoresist 1831 that has been applied to a wafer 1830. (Examples for forming contact elements in patterned photoresist or like material can be found in the following above-identified patent documents: U.S. Pat. No. 6,184,053; U.S. patent application Ser. No. 09/032,473, filed Feb. 26, 1998; U.S. patent application Ser. No. 09/364,788, filed Jul. 30, 1999; U.S. patent application Ser. No. 09/710,539, filed Nov. 9, 2000; U.S. patent application Ser. No. 09/781,833, filed Feb. 12, 2001; U.S. patent application Ser. No. 09/795,772, filed Feb. 27, 2001; and U.S. patent application Ser. No. 09/880,658, filed Jun. 13, 2001.)

Once the contact elements 1850 are formed on the terminals 1840 of the dice 1832 of the wafer 1830, the wafer may be singulated from the bottom (with respect to the orientation depicted in FIG. 18B) of the wafer through the scribe streets 1834. (It should be apparent that the size of the scribe streets shown in FIG. 18B are exaggerated for clarity.) The wafer is cut through to the photoresist 1831 formed over each scribe street 1834. The photoresist 1831, however, is not cut through. Consequently, the photoresist 1831 formed over a scribe street 1834 holds the wafer together even after the wafer has been singulated. An adhesive (not shown in FIGS. 18A and 18B) may then be applied to the back side of the wafer (the bottom side as depicted in FIG. 18B) as discussed above. The photoresist 1831 may then be removed from the wafer 1830 and the now singulated dice 1832 removed from the adhesive as discussed above.

Although not shown in FIGS. 3A–4B and 9A–18B, packaging may be formed on all or a portion of the dice before or after forming interconnect elements on the terminals of the dice. That is, a step of applying packaging to the die while in wafer form may be added to FIG. 2 before or after the step 204 of forming interconnect elements on terminals of the wafer. Many materials and processes for packaging unsingulated dice in wafer form are known, and any such materials and processes may be used with the present invention. Such packaging may consist of a single material applied to protect the die; alternatively, such packaging may consist of multiple layers of materials, which may be formed sequentially on the die or may be formed separately from the die and then attached to the die.

Such packaging may cover a portion or all of each die 332, 932, 1132, and such packaging may serve any of many purposes, including without limitation protecting the die, strengthening the die, dissipating heat generated by operation of the circuitry on the die, etc. Such packaging may also include stop structures to prevent interconnect elements 350, 950, 1150 from being compressed toward the die beyond a surface of the stop structures.

It should be noted that the interconnect elements 350, 950, 1150 may be formed on an outer surface of any packaging layer applied to the dice 332, 932, 1132. In such a case, the packaging and the interconnect elements may be formed layer by layer on the dice. Alternatively, such packaging and the interconnect elements may be formed separate from the wafer and then attached to the unsingulated wafer.

Figure 19:
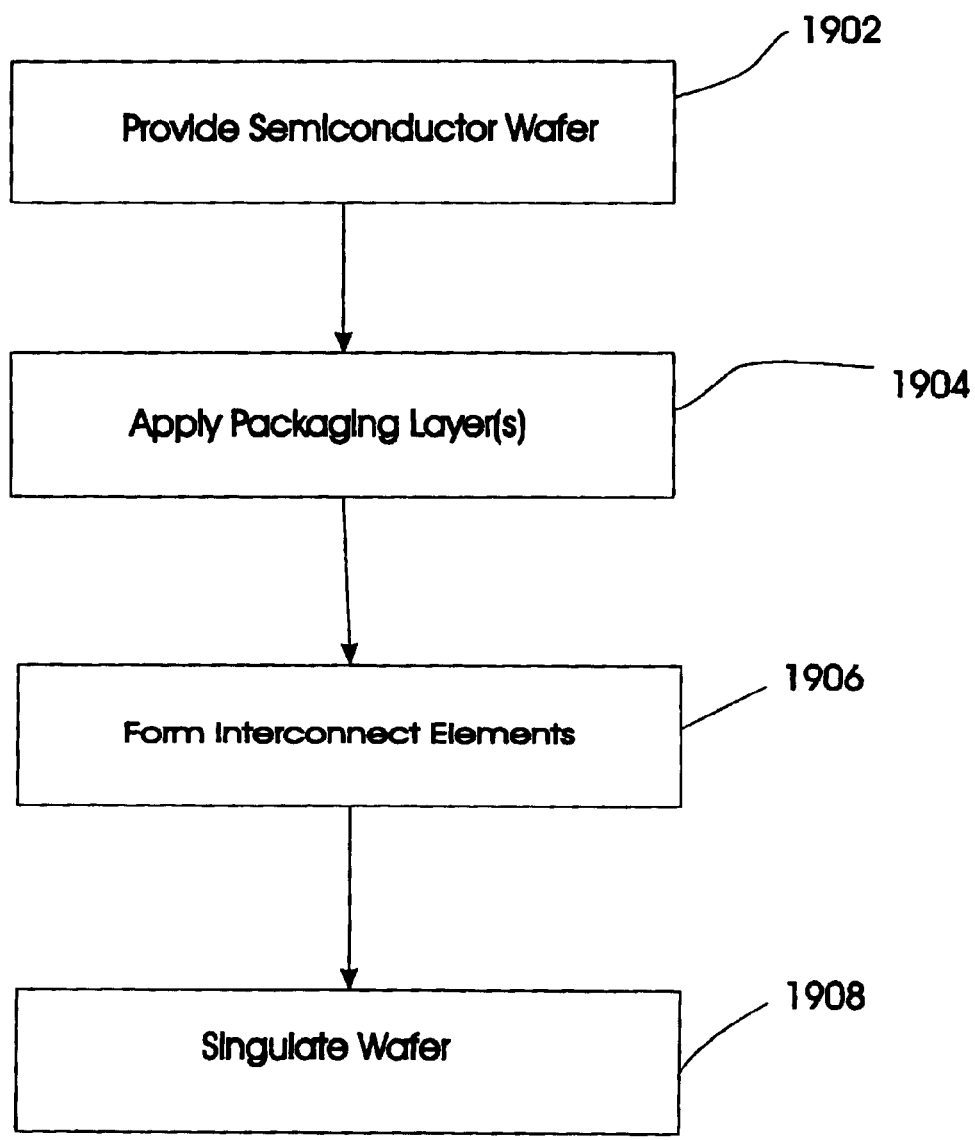
FIG. 19 illustrates an exemplary embodiment of a process incorporating the present invention.

As discussed above, interconnect elements used with the embodiment of the invention illustrated in FIG. 2 must be elongate in the sense that they must have a length sufficient to extend from a terminal on a die to a point or area beyond the boundary of the die. As also discussed above, although the wire-bond-style interconnect elements described in connection with FIG. 5 and the lithographically-created-style interconnect elements described in connection with FIGS. 6A–8D are preferred interconnection elements, any elongate interconnection element having sufficient length to extend from a terminal on a die to a point beyond the boundary of the die may be used with the present invention, and in particular, with the exemplary embodiments illustrated in and described with respect to FIG. 2. FIG. 19 illustrates an alternative exemplary embodiment of the invention in which interconnect elements that are not elongate (that is, do not have sufficient length to extend from a connection point on a die to a point beyond the boundary of the die) may be used.

As illustrated in FIG. 19, a semiconductor wafer is provided at step 1902. This step may be similar or identical to step 202 in FIG. 2. FIGS. 20A and 21A (which illustrates a cross-section view of FIG. 20A) show top and cross-section side views, respectively, of a portion of an exemplary semiconductor wafer 2030 that may be provided in step 1902 of FIG. 19. The wafer 2030 and dice 2032 may be similar or the same as the wafer and dice illustrated in FIGS. 1, 3A, 9A, and/or 11A above. Referring to FIGS. 20A and 20A, three exemplary dice (of many) 2032 are shown. Each die 2032 includes a plurality of terminals 2040 for making electrical connections with the circuitry (not shown) on the die. As also shown, scribe streets 2034 provide space between each die 2032 to allow the wafer 2030 to be singulated into individual dice.

Figure 20B:
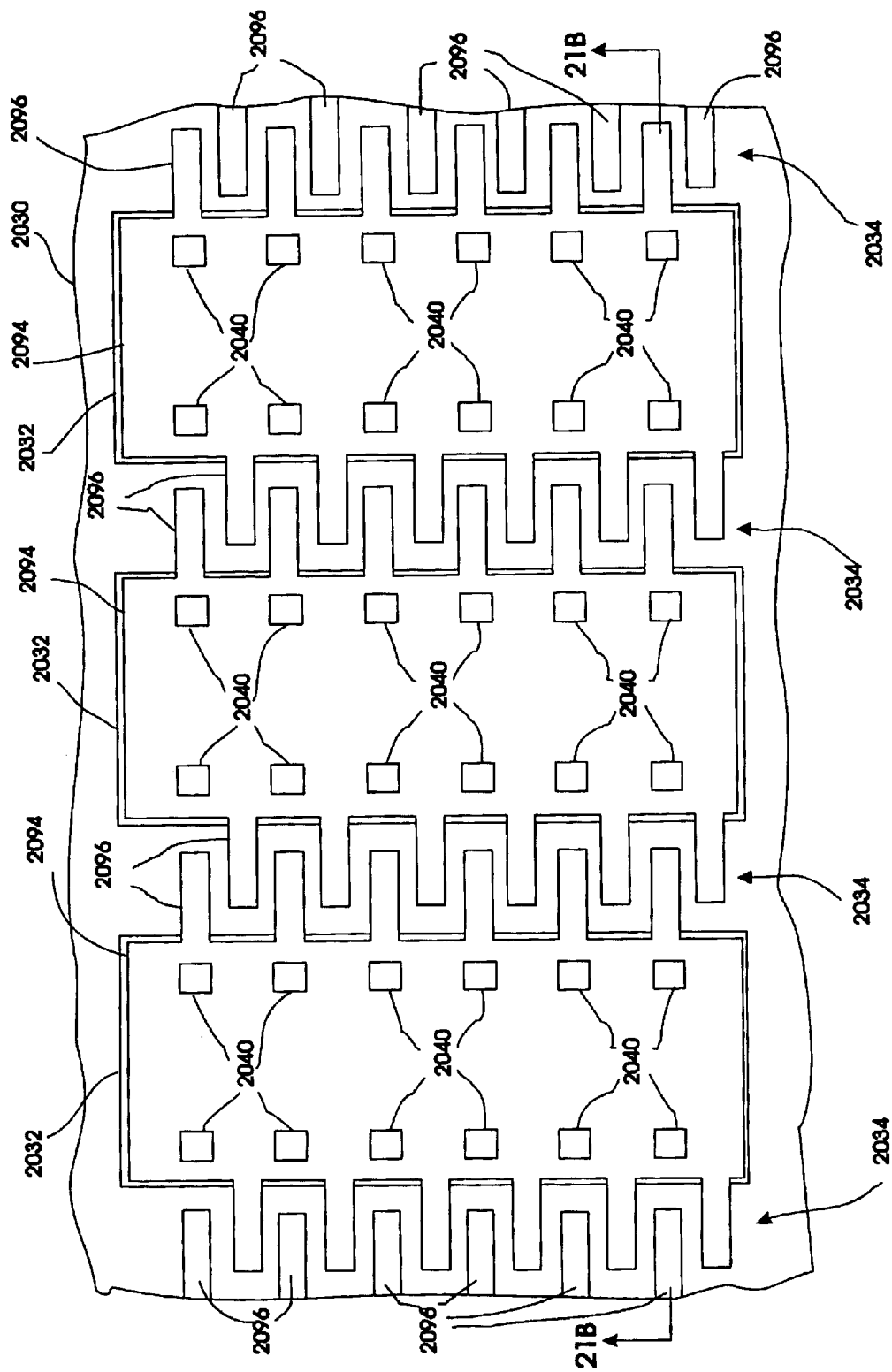
FIGS. 20B–20D are top views of the wafer of FIG. 20A showing, respectively, a packaging layer, conductive traces, and interconnect elements attached thereto.

At step 1904 in FIG. 19, one or more packaging layers are applied to each die 2032 on the semiconductor wafer 2030. FIGS. 20B and 21B (which illustrates a cross-section view of FIG. 20B) illustrate application of exemplary packaging 2094 to the dice 2032.

As shown in FIGS. 20B and 21B, the packaging 2094 may generally cover each die 2032. Openings in the packaging 2094, however, correspond to terminals 2040, making these terminals accessible through the packaging. Importantly, the packaging includes extensions or "fingers" 2096 that extend beyond the boundaries of a die 2032 into a scribe street 2034. As shown in FIG. 20B, "fingers" 2096 extending from one die 2032 form a generally interlocking pattern with fingers extending from a neighboring die. As will be seen, the "fingers" 2096 form a base or platform for supporting interconnect elements that are not elongate.

Use of a particular material or materials from which the exemplary packaging 2094 illustrated in FIGS. 20B and 21B is formed is not important to the present invention. Many materials are known for packaging a semiconductor die, and any such material or materials may be used to form the packaging 2094. Such materials may be chosen for their ability to protect the circuitry (not shown) on the die 2032, to strengthen the die, and/or to dissipate heat generated by operation of the circuitry on the die. In addition, the material may be chosen to achieve other beneficial results. Exemplary materials include but are not limited to plastics, resins, metals, and organic materials.

The packaging 2094 illustrated in FIGS. 20B and 21B may be formed of one layer of an insulating material, or the packaging may alternatively be formed of multiple layers, and some of those layers may include conductive or semiconductive materials. For example, a plurality of insulating and conductive materials may be configured to provide a generally insulative covering over the active side of the die, where the packaging includes embedded conductive paths for redistributing the locations of the terminals 1940 at the top of outer surface or the packaging.

In addition, although the packaging 2094 shown in FIGS. 20B and 21B covers most of the active surface area of a die 2032, the packaging could alternatively be formed such that it covers only a portion or portions of the die. For example, only "fingers" (similar to the "fingers" 2096 shown in FIG. 20B) could be formed, extending from a terminal 2040 into a scribe street 2034.

Figure 20C:
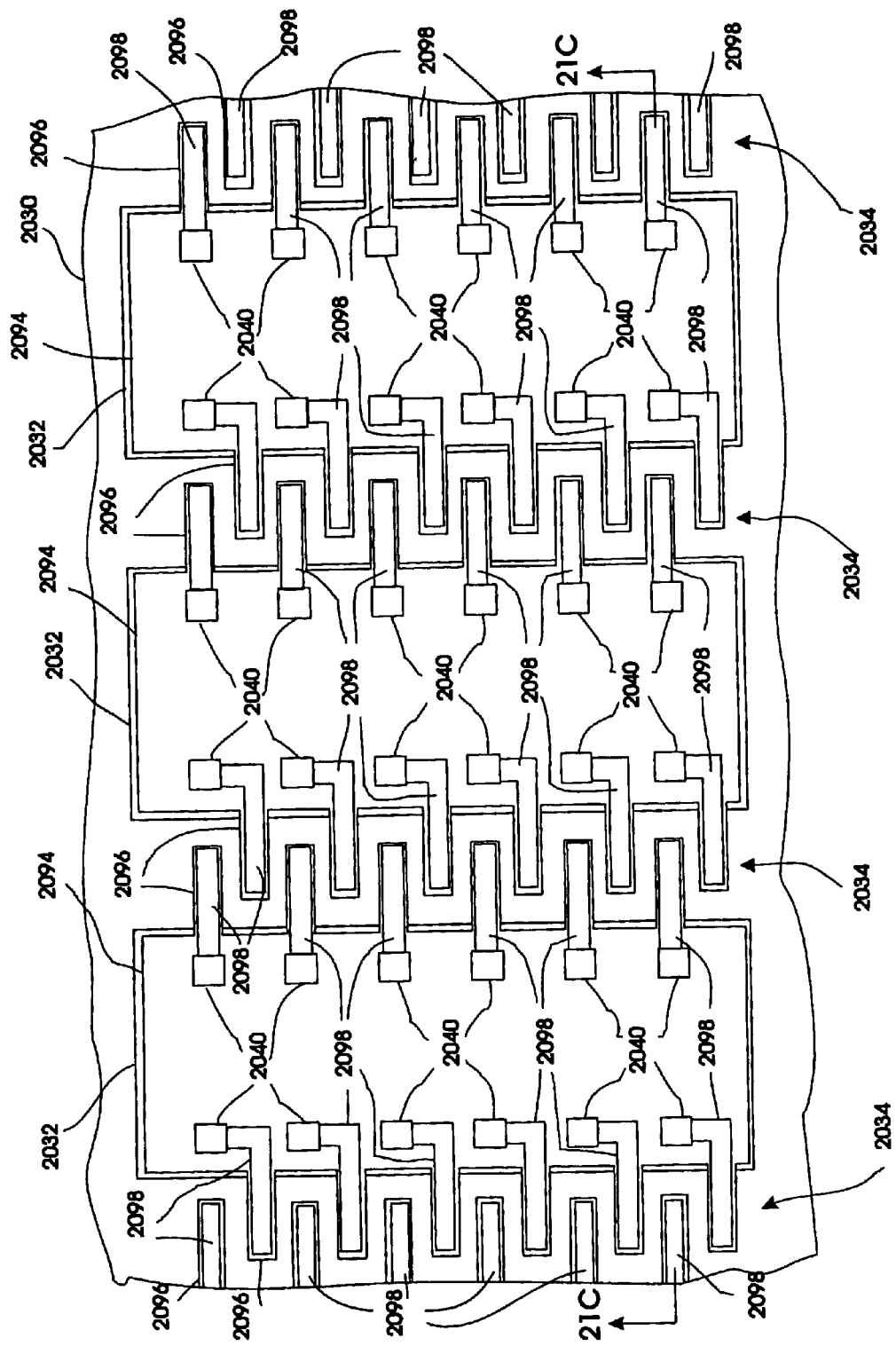
Figure 21C:
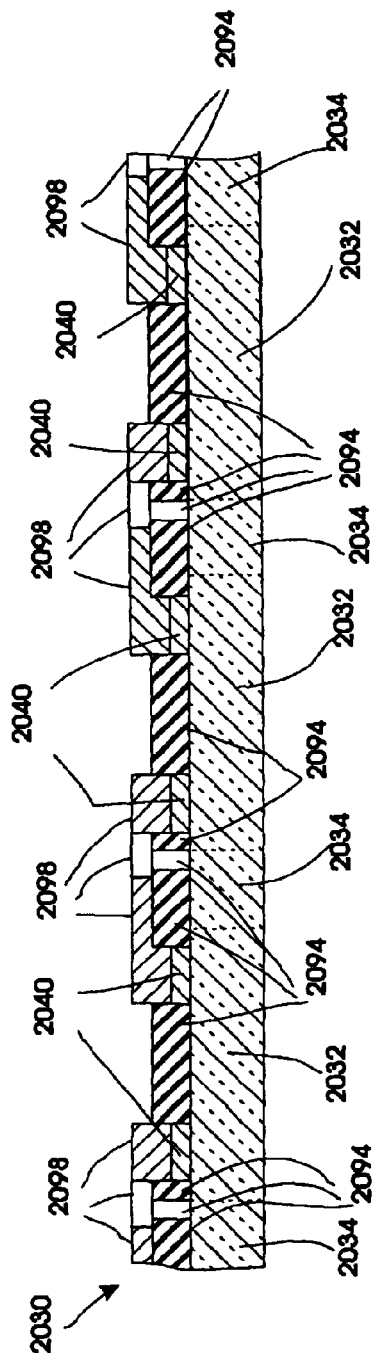

After the packaging 2094 has been applied, conductive traces 2098 are formed on the packaging, as shown in FIGS. 20C and 21C (which illustrates a cross-section view of FIG. 20C). The conductive traces form a conductive path from a terminal 2040 to an end of a "finger" 2096, as also shown in FIGS. 20C and 21C.

Figure 20D:
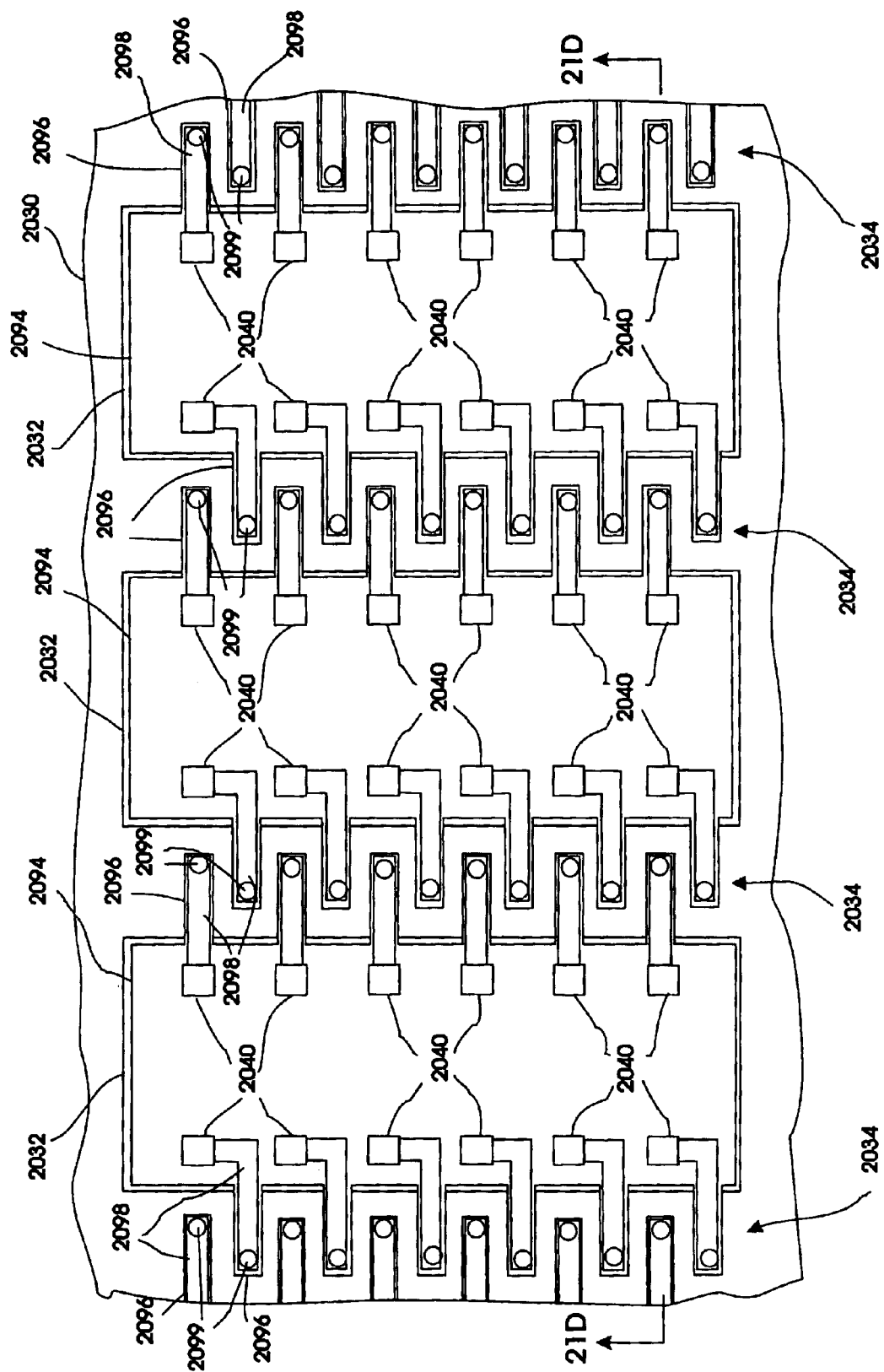
Figure 21D:
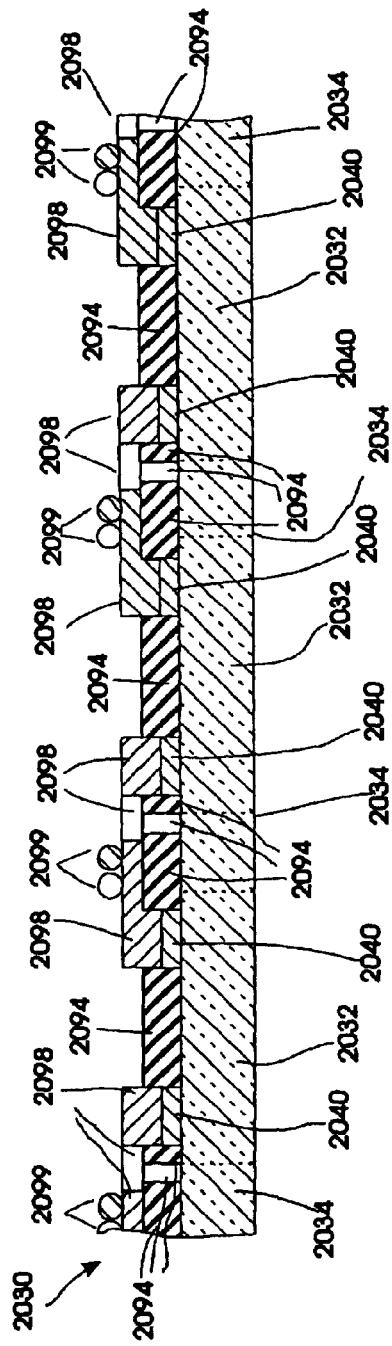

Referring again to FIGS. 19 and to FIGS. 20D and 21D (which illustrates a cross-section view of FIG. 20D), at step 1906, interconnect elements 2099 are formed on or attached to the conductive traces 2098 near the end of the "fingers" 2096. The interconnect elements 2099 may be any type of interconnect element suitable for providing an electrical connection to a terminal 2040 on a semiconductor die. Nonexclusive examples of such interconnect terminals include metal pins, solder balls, metal bumps, and metal pads. Although the "fingers" 2096 are formed to allow non-elongate interconnection elements to be used with the present invention and such "fingers" are not necessary if elongate interconnection elements are used, elongate interconnection elements may nevertheless be formed on or attached to the conductive traces 2098 on the ends of the "fingers" 2096.

Of course, although not shown in FIGS. 20A–21D, additional packaging layers or materials may be applied to the die 2032. For example, an additional layer of a protective material could be applied over the packaging 2094 and the conductive traces 2098. Materials could also be applied around the interconnection elements 2099 to strengthen the bond between the interconnection elements and the conductive traces 2098. Any such additional packaging layers, however, are optional and need not be used with the present invention.

It should be noted that the packaging 2094, conductive traces 2098, and interconnect elements 2099 may be formed one layer and/or item at a time on the wafer using standard semiconductor fabrication techniques as illustrated in FIGS. 20A–21D. Alternatively, the combination of the packaging 2094, conductive traces 2098, and the interconnect elements 2099 may be formed separately from the wafer 2030 and then joined to wafer.

After steps 1902–1906 have been completed, the wafer 2030 is singulated into individual die 2032 at step 1908 of FIG. 19. Any of the processes illustrated in FIGS. 13A–16E may be used to singulate the wafer 2030. Moreover, after the dice 2032 have been singulated, additional packaging may be applied to the singulated dice. Any such additional packaging, however, is optional.

Although the example illustrated in FIGS. 20A–21D shows the "fingers" 2096 of packaging 2094 extending into the scribe streets 2034 but not extending into the boundary of a neighboring die 2032, the "fingers" may extend across a scribe street and into the boundary of a neighboring die. If this is done, a layer of "release" material (not shown in FIGS. 20A–21D) is preferably formed on the scribe street 2034 and on portions of the dice 2032 over which a "finger" from a neighboring die 2032 will be formed. The "release" material is preferably formed between the surface of the wafer 2030 and the packaging 2094. The "release" material preferably is a material that will allow the portions of the "fingers" that overhang a neighboring die to be easily separated from the neighboring die.

It should be apparent that the invention provides many advantages. For example, flip chip mounted dice having contact elements that extend beyond the boundary of the dice can be made. As another example, as the die size for a particular integrated circuit design shrinks over time, the same foot print for contact elements can be maintained.

Although the principles of the present invention have been illustrated and explained in the context of specific embodiments, it will be appreciated by those having skill in the art that various modifications beyond those illustrated can be made to the disclosed embodiments without departing from the principles of the present invention.

Figure 22:
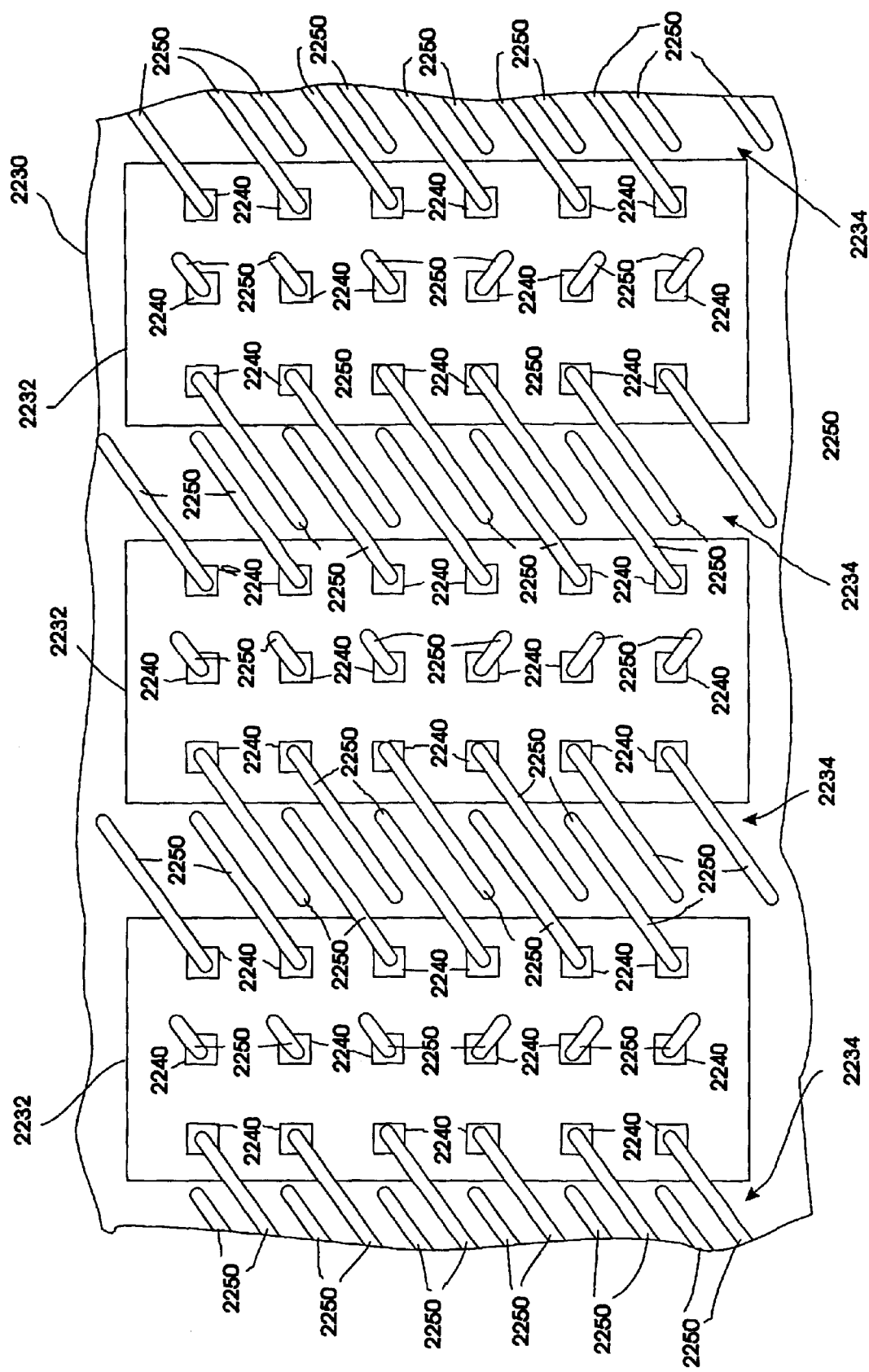
FIG. 22 is a top view of a portion of an unsingulated wafer showing three exemplary dice.

For example, although not shown in any of the figures of the application, additional packaging may be applied to any of the dice described herein after the dice have been singulated from a wafer. As another example, it should be apparent that, although each of the examples described above shows interconnect elements extending from two sides of each die, interconnect elements could be formed to extend from only one side of a die or from three or all four sides of a die. As yet another example, not all of the contact elements need extend beyond the boundary of a die. For example, every other one of the contact elements 950 along one side of a die 932 shown in FIG. 9B may be shortened such that they do not extend beyond the boundary of the die. As another example, the contact elements 950 along one side of a die 932 may extend beyond the boundary of the die as shown in FIG. 9B, but contact elements 950 along the other side of the die may be shortened such that they do not extend beyond the boundary of the die. FIG. 22 illustrates another example in which some but not all of the contact elements 2250 on terminals 2240 of dice 2232 extend beyond the boundaries of the dice. (The exemplary dice 2232 are formed on wafer 2230 with scribe streets 2234 between the dice.) In the example illustrated in FIG. 22, contact elements 2250 attached to an inner column of terminals 2240 do not extend beyond the boundary of the die.

Other examples of modifications that may be made to the above described embodiments include replacing the adhesive used temporarily to hold a singulated wafer together with a magnetic plate (which may be attracted to the metallic contact elements or other metallic elements on a wafer). (See the above discussion regarding FIGS. 13A–16E.) Alternatively, an unprocessed silicon wafer applied with a sticky or adhesive substance may be used as the adhesive in the above described embodiments. As yet another alternative, a wafer 130 as shown in FIG. 1 may be cut or scribed along all of its horizontal scribe streets; contact elements may then be formed on the dice 132 overhanging only the horizontal scribe streets but not the vertical scribe streets; thereafter, the wafer 130 may be cut or scribed along its vertical scribe streets. Of course, the vertical scribe streets could be initially cut, contact elements formed overhanging the vertical scribe streets, and then the horizontal scribe streets cut.

As yet another example, a support ring may be added to the a wafer (e.g., wafer 930 shown in FIG. 9B) to support the ends of contact elements 950. As still another example, the principles of the invention may be applied to forming contact elements on panels for semiconductor packages, which are often formed from a single piece of printed circuit board and then singulated into individual panels. In accordance with the principles of the invention discussed above, contact elements that overhang the boundaries of the panels may be formed on terminals of the panels before singulating the panels.

All of the foregoing as well as other modifications to and departures from the disclosed embodiments are deemed to be within the scope of the following claims.

What is claimed is:

1. A method comprising:
providing an unsingulated semiconductor wafer comprising a plurality of dice and space between adjacent ones of said dice, each said die having a plurality of electrical terminals disposed within a boundary of said die;
forming resilient, elongate interconnect elements on at least one of said dice, said interconnect elements extending beyond the boundary of said at least one die into said space between said at least one die and an adjacent die, said interconnect elements being in electrical communication with the terminals of said at least one die; and
thereafter singulating said wafer into individual dice.

2. The method of claim 1, wherein said interconnect elements are formed on a plurality of said dice such that interconnect elements on adjacent dice are interposed between each other in interleaved fashion.

3. The method of claim 1, wherein said singulating comprises:
affixing a fixative to said wafer,
dicing said wafer along scribe streets between said dice, and
removing individual die from said fixative.

4. The method of claim 3, wherein said fixative comprises adhesive tape.

5. The method of claim 3, wherein said dicing is performed from a side of said wafer opposite a side on which said plurality of terminals are disposed.

6. The method of claim 1, wherein said elongate interconnect elements comprise an inner wire core and a coating.

7. The method of claim 6, wherein said coating is formed of a material that is stronger than said wire core.

8. The method of claim 6, wherein said coating is formed of a material that is more resilient than said wire core.

9. The method of claim 1, wherein said elongate interconnect elements are lithographically formed.

10. The method of claim 1 further including adhering a stretchy material to said plurality of dice, and, after singulating said wafer, stretching said stretchy material to increase space between said dice.

11. The method of claim 1, wherein said singulating comprises:
affixing a first fixative to a front side of said wafer, wherein said front side is a side on which said plurality of terminals are disposed, dicing said wafer along scribe streets between said dice, affixing a second fixative to a back face of said wafer, and removing said first fixative from said wafer.

12. The method of claim 1, further comprising grinding said wafer prior to singulating said wafer.

13. The method of claim 1, further comprising polishing said wafer prior to singulating said wafer.

14. The method of claim 1, wherein said elongate interconnect elements extend across said space between said at least one die and a neighboring die and into the boundary of said neighboring die.

15. A method comprising:
   providing an unsingulated semiconductor wafer comprising a plurality of dice formed thereon, each said die having a plurality of electrical terminals disposed within a boundary of said die;
   forming packaging on a plurality of said dice, packaging for one die being distinct and separate from packaging for another die, said packaging for each said die including a plurality of extensions extending beyond the boundary of said die;
   forming on said plurality of extensions a plurality of interconnect elements, said interconnect elements being in electrical communication with the terminals of said at least one die; and
   thereafter singulating said wafer into individual dice.

16. A method comprising:
   providing an unsingulated semiconductor wafer comprising a plurality of dice formed thereon, each said die having a plurality of electrical terminals disposed within a boundary of said die;
   forming packaging on at least one of said dice, said packaging for each said die including a plurality of extensions extending beyond the boundary of said at least one die;
   forming on said plurality of extensions a plurality of interconnect elements, said interconnect elements being in electrical communication with the terminals of said at least one die; and
   thereafter singulating said wafer into individual dice,
   wherein said extensions are formed on a plurality of said dice such that said extensions on adjacent dice are interposed between each other in interleaved fashion.

17. The method of claim 15, wherein said singulating comprises:
   affixing a fixative to said wafer,
   dicing said wafer along a scribe streets between said dice, and
   removing individual die from said fixative.

18. The method of claim 17, wherein said fixative comprises adhesive tape.

19. The method of claim 17, wherein said dicing is performed from a side of said wafer opposite a side on which said plurality of terminals are disposed.

20. The method of claim 15 further including adhering a stretchy material to said plurality of dice, and, after singulating said wafer, stretching said stretchy material to increase space between said dice.

21. The method of claim 15, wherein said singulating comprises:
   affixing a first fixative to a front side of said wafer, wherein said front side is a side on which said plurality of terminals are disposed,
   dicing said wafer along scribe streets between dice,
   affixing a second fixative to a back face of said wafer, and,
   removing said first fixative from said wafer.

22. The method of claim 15, further comprising grinding said wafer prior to singulating said wafer.

23. The method of claim 15, further comprising polishing said wafer prior to singulating said wafer.

24. A method comprising:
   providing an unsingulated semiconductor wafer comprising a plurality of dice formed thereon, each said die having a plurality of electrical terminals disposed within a boundary of said die;
   forming packaging on at least of said dice, said packaging for each said die including a plurality of extensions extending beyond the boundary of said at least one die;
   forming on said plurality of extensions a plurality of interconnect elements, said interconnect elements being in electrical communication with the terminals of said at least one die; and
   thereafter singulating said wafer into individual dice,
   wherein said extensions extend across a scribe street between said at least one die and a neighboring die and into the boundary of said neighboring die.

25. A method comprising:
   providing an unsingulated semiconductor wafer comprising a plurality of dice formed thereon, each said die having a plurality of electrical terminals disposed within a boundary of said die;
   applying a first fixative to a back side of said wafer, said back side of said wafer being a side opposite a side on which said electrical terminals are formed;
   singulating said wafer from a front side of said wafer while said first fixative is applied to said wafer; and
   forming resilient elongate interconnect elements on at least one of said dice while said first fixative is applied to said singulated wafer, said interconnect elements extending beyond the boundary of said at least one die, said interconnect elements being in electrical communication with the terminals of said at least one die.

26. The method of claim 25 further comprising:
   applying a second fixative to a front side of said wafer; and
   removing said first fixative from said wafer.

27. A method comprising:
   providing an unsingulated semiconductor wafer comprising a plurality of dice formed thereon, each said die having a plurality of electrical terminals disposed within a boundary of said die;
   applying a first fixative to a back side of said wafer, said back side of said wafer being a side opposite a side on which said electrical terminals are formed;
   singulating said wafer from a front side of said wafer while said first fixative is applied to said wafer; and
   forming elongate interconnect elements on at least one of said dice while said first fixative is applied to said singulated wafer, said interconnect elements extending beyond the boundary of said at least one die, said interconnect elements being in electrical communication with the terminals of said at least one die,
   wherein said interconnect elements are formed on a plurality of said dice such that interconnect elements on adjacent dice are interposed between each other in interleaved fashion.

28. The method of claim 25, wherein said first fixative comprises adhesive tape.

29. A method comprising:

providing an unsingulated semiconductor wafer comprising a plurality of dice formed thereon, each said die having a plurality of electrical terminals disposed within a boundary of said die;

applying a first fixative to a back side of said wafer, said back side of said wafer being a side opposite a side on which said electrical terminals are formed;

singulating said wafer from a front side of said wafer while said first fixative is applied to said wafer; and forming elongate interconnect elements on at least one of said dice while said first fixative is applied to said singulated wafer, said interconnect elements extending beyond the boundary of said at least one die, said interconnect elements being in electrical communication with the terminals of said at least one die, wherein said elongate interconnect elements comprise an inner wire core and a coating.

30. The method of claim 29, wherein said coating is formed of a material that is stronger than said wire core.

31. The method of claim 29, wherein said coating is formed of a material that is more resilient than said wire core.

32. The method of claim 25, wherein said elongate interconnect elements are lithographically formed.

33. A method comprising:

providing an unsingulated semiconductor wafer comprising a plurality of dice formed thereon, each said die having a plurality of electrical terminals disposed within a boundary of said die;

applying a first fixative to a back side of said wafer, said back side of said wafer being a side opposite a side on which said electrical terminals are formed;

singulating said wafer from a front side of said wafer while said first fixative is applied to said wafer; and forming elongate interconnect elements on at least one of said dice while said first fixative is applied to said singulated wafer, said interconnect elements extending beyond the boundary of said at least one die, said interconnect elements being in electrical communication with the terminals of said at least one die, wherein said elongate interconnect elements extend across a scribe street between said at least one die and a neighboring die and into the boundary of said neighboring die.

* * * * *